United States Patent
Yamazaki et al.

(10) Patent No.: US 9,496,405 B2
(45) Date of Patent: Nov. 15, 2016

(54) METHOD FOR MANUFACTURING SEMICONDUCTOR DEVICE INCLUDING STEP OF ADDING CATION TO OXIDE SEMICONDUCTOR LAYER

(75) Inventors: Shunpei Yamazaki, Tokyo (JP); Hideomi Suzawa, Kanagawa (JP); Shinya Sasagawa, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 131 days.

(21) Appl. No.: 13/107,054

(22) Filed: May 13, 2011

(65) Prior Publication Data

US 2011/0287580 A1 Nov. 24, 2011

(30) Foreign Application Priority Data

May 20, 2010 (JP) .................................. 2010-115940

(51) Int. Cl.
 *H01L 21/336* (2006.01)
 *H01L 29/786* (2006.01)
 (Continued)

(52) U.S. Cl.
 CPC ....... *H01L 29/7869* (2013.01); *H01L 27/1225* (2013.01); *H01L 29/66969* (2013.01)

(58) Field of Classification Search
 USPC ......... 438/104, 149, 289, 290; 257/E21.411, 257/E21.413, E21.414, E29.296, E29.273,
 (Continued)

(56) References Cited

U.S. PATENT DOCUMENTS

| 5,313,075 A | 5/1994 | Zhang et al. |
| 5,585,949 A | 12/1996 | Yamazaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Zandra Smith
*Assistant Examiner* — Abbigale Boyle
(74) *Attorney, Agent, or Firm* — Robinson Intellectual Property Law Office; Eric J. Robinson

(57) ABSTRACT

An object of an embodiment of the present invention is to provide a semiconductor device including a normally-off oxide semiconductor element whose characteristic variation is small in the long term. A cation containing one or more elements selected from oxygen and halogen is added to an oxide semiconductor layer, thereby suppressing elimination of oxygen, reducing hydrogen, or suppressing movement of hydrogen. Accordingly, carriers in the oxide semiconductor can be reduced and the number of the carriers can be kept constant in the long term. As a result, the semiconductor device including the normally-off oxide semiconductor element whose characteristic variation is small in the long term can be provided.

36 Claims, 19 Drawing Sheets

(51) Int. Cl.
*H01L 27/12* (2006.01)
*H01L 29/66* (2006.01)
(58) Field of Classification Search
USPC .................................................. 257/E21.144
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,087,615 A * | 7/2000 | Schork et al. ............ | 219/121.43 |
| 6,214,707 B1 * | 4/2001 | Thakur ............... | H01L 21/2233 |
| | | | 257/E21.142 |
| 6,294,274 B1 | 9/2001 | Kawazoe et al. | |
| 6,451,390 B1 * | 9/2002 | Goto et al. .................... | 427/579 |
| 6,468,844 B1 * | 10/2002 | Yamazaki et al. ............ | 438/156 |
| 6,563,174 B2 | 5/2003 | Kawasaki et al. | |
| 6,727,522 B1 | 4/2004 | Kawasaki et al. | |
| 6,849,872 B1 * | 2/2005 | Yamazaki et al. .............. | 257/66 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,084,307 B2 | 12/2011 | Itagaki et al. | |
| 8,343,817 B2 | 1/2013 | Miyairi et al. | |
| 8,461,007 B2 | 6/2013 | Yamazaki | |
| 8,492,757 B2 | 7/2013 | Sakata et al. | |
| 8,518,740 B2 | 8/2013 | Yamazaki et al. | |
| 8,748,879 B2 | 6/2014 | Yano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 * | 2/2004 | Takeda et al. ................. | 438/104 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 * | 5/2006 | Yabuta et al. ................ | 438/151 |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048164 A1 * | 2/2008 | Odagawa ......................... | 257/2 |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0283831 A1 * | 11/2008 | Ryu et al. ........................ | 257/43 |
| 2008/0296568 A1 * | 12/2008 | Ryu et al. ........................ | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0294772 A1 * | 12/2009 | Jeong et al. ..................... | 257/59 |
| 2010/0025678 A1 | 2/2010 | Yamazaki et al. | |
| 2010/0038641 A1 * | 2/2010 | Imai ............................... | 257/57 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0276688 A1 | 11/2010 | Yano et al. | |
| 2010/0283049 A1 | 11/2010 | Sato et al. | |
| 2010/0320459 A1 | 12/2010 | Umeda et al. | |
| 2011/0003429 A1 | 1/2011 | Oikawa et al. | |
| 2011/0050733 A1 | 3/2011 | Yano et al. | |
| 2011/0089416 A1 | 4/2011 | Yamazaki et al. | |
| 2011/0215325 A1 | 9/2011 | Yamazaki et al. | |
| 2011/0215331 A1 | 9/2011 | Yamazaki et al. | |
| 2011/0260171 A1 | 10/2011 | Yamazaki | |
| 2011/0263082 A1 | 10/2011 | Yamazaki | |
| 2011/0263083 A1 | 10/2011 | Yamazaki | |
| 2011/0263084 A1 | 10/2011 | Yamazaki | |
| 2011/0263085 A1 | 10/2011 | Yamazaki | |
| 2011/0263091 A1 | 10/2011 | Yamazaki | |
| 2011/0281394 A1 | 11/2011 | Yamazaki | |

FOREIGN PATENT DOCUMENTS

| | | |
|---|---|---|
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-034926 | 2/1990 |
| JP | 05-251705 A | 9/1993 |
| JP | 08-264794 | 10/1996 |
| JP | 11008238 A * | 1/1999 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 | 5/2000 |
| JP | 2001-125141 A | 5/2001 |
| JP | 2002-076356 A | 3/2002 |
| JP | 2002-289859 A | 10/2002 |
| JP | 2003-086000 A | 3/2003 |
| JP | 2004-103957 | 4/2004 |
| JP | 2004-273614 A | 9/2004 |
| JP | 2004-273732 A | 9/2004 |
| JP | 2006-165527 A | 6/2006 |
| JP | 2007-220816 | 8/2007 |
| JP | 2007-299913 A | 11/2007 |
| JP | 2010-021170 | 1/2010 |
| WO | WO-2008/062720 | 5/2008 |
| WO | WO-2008/136505 | 11/2008 |
| WO | WO-2009/031423 | 3/2009 |
| WO | WO-2009/072532 | 6/2009 |

OTHER PUBLICATIONS

Nakamura et al., "The Phase Relations In the $In_2O_3$—$Ga_2ZnO_4$—ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides $(InFeO_3(ZnO)_m)$ (m: natural number) and related compounds," Kotai Butsuri (Solid State Physics), 1993, vol. 28, No. 5, pp. 317-327, 1993.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Fung et al. "Bias Temperature Stress Study of R.F. Sputter Amorphous In—Ga—Zn—O TFTs," IDW'08, Dec. 3, 2008, pp. 1621-1624.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashlm et al., "Theoretical Analysis of IGZO Transparent Amorphous Oxide Semiconductor,", IDW '08 : Proceedings of the 15th International Display Workshops, Dec. 3, 2008, pp. 1637-1640.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp.", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

(56) References Cited

OTHER PUBLICATIONS

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

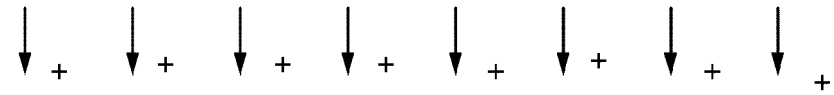
FIG. 6A
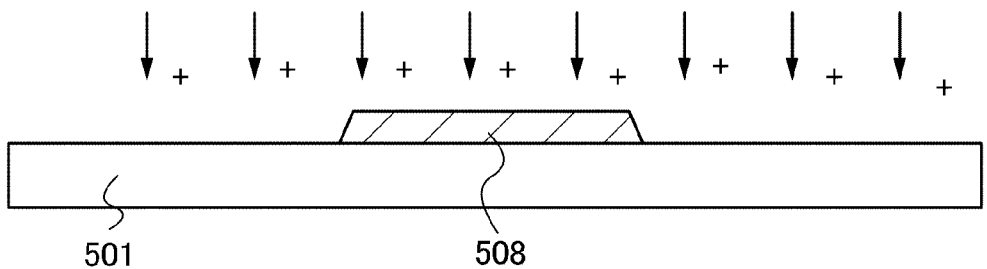
FIG. 6B
FIG. 6C
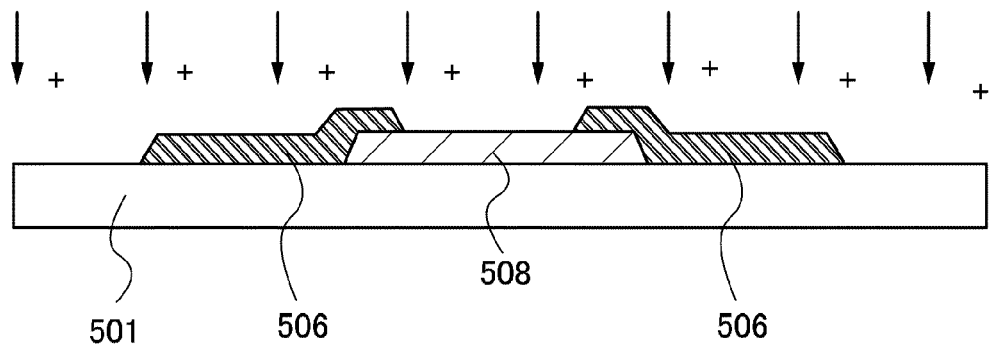
FIG. 6D
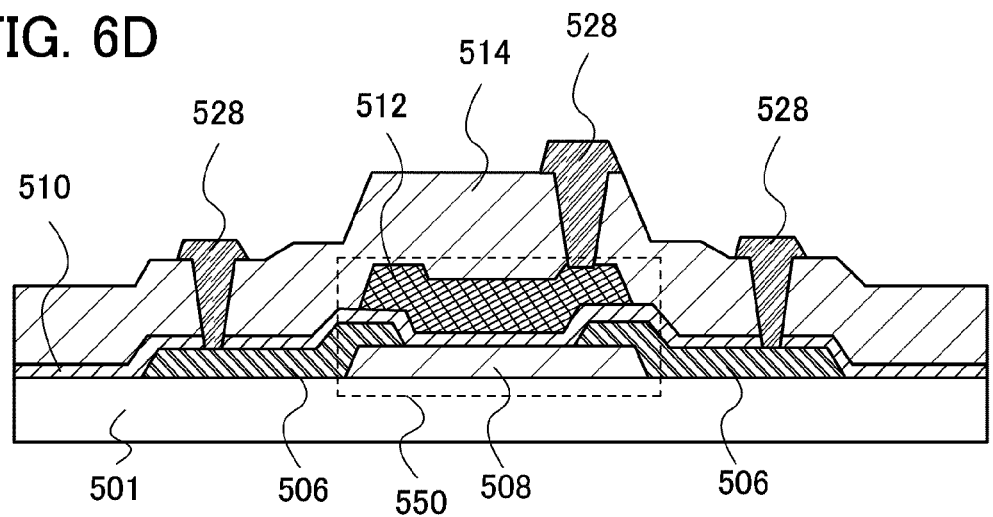

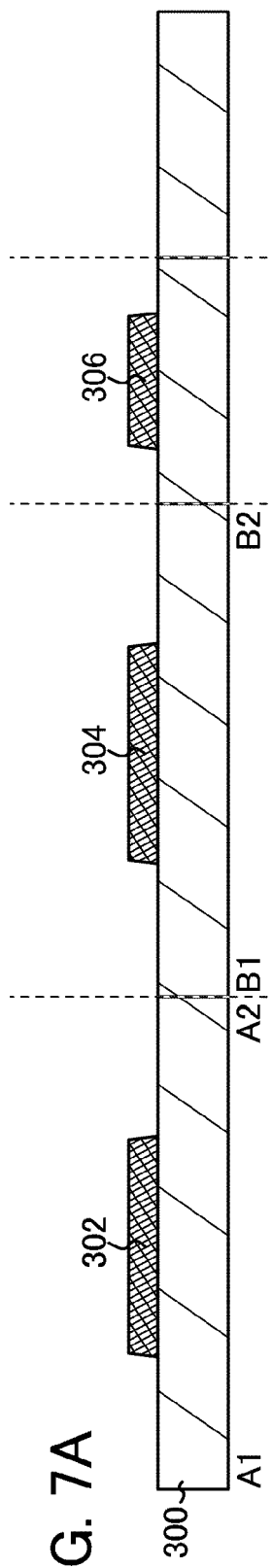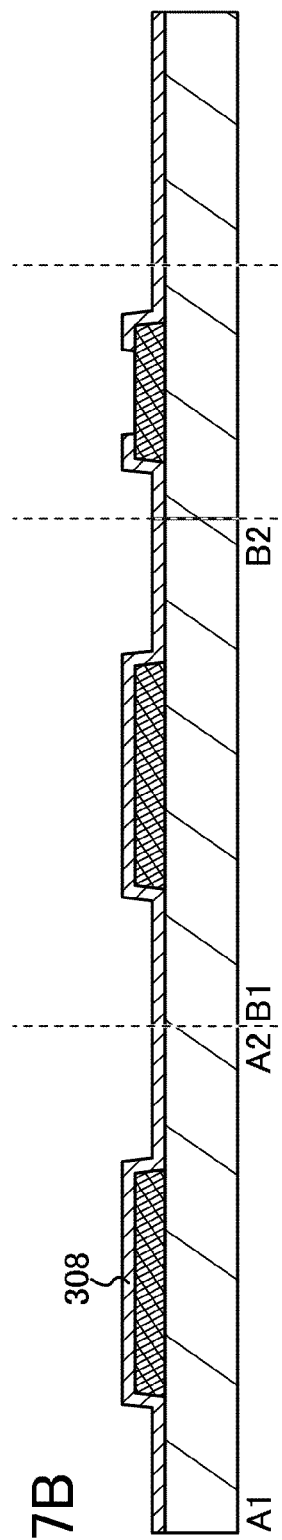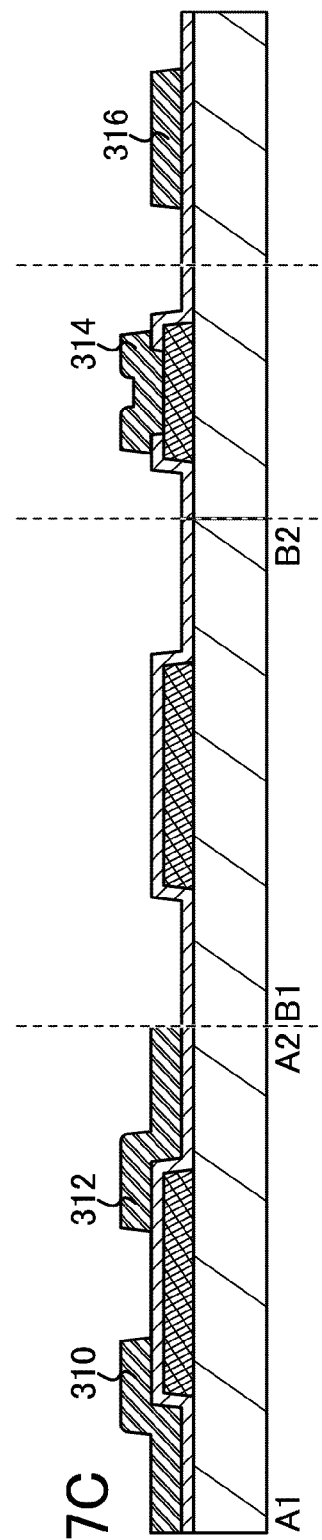

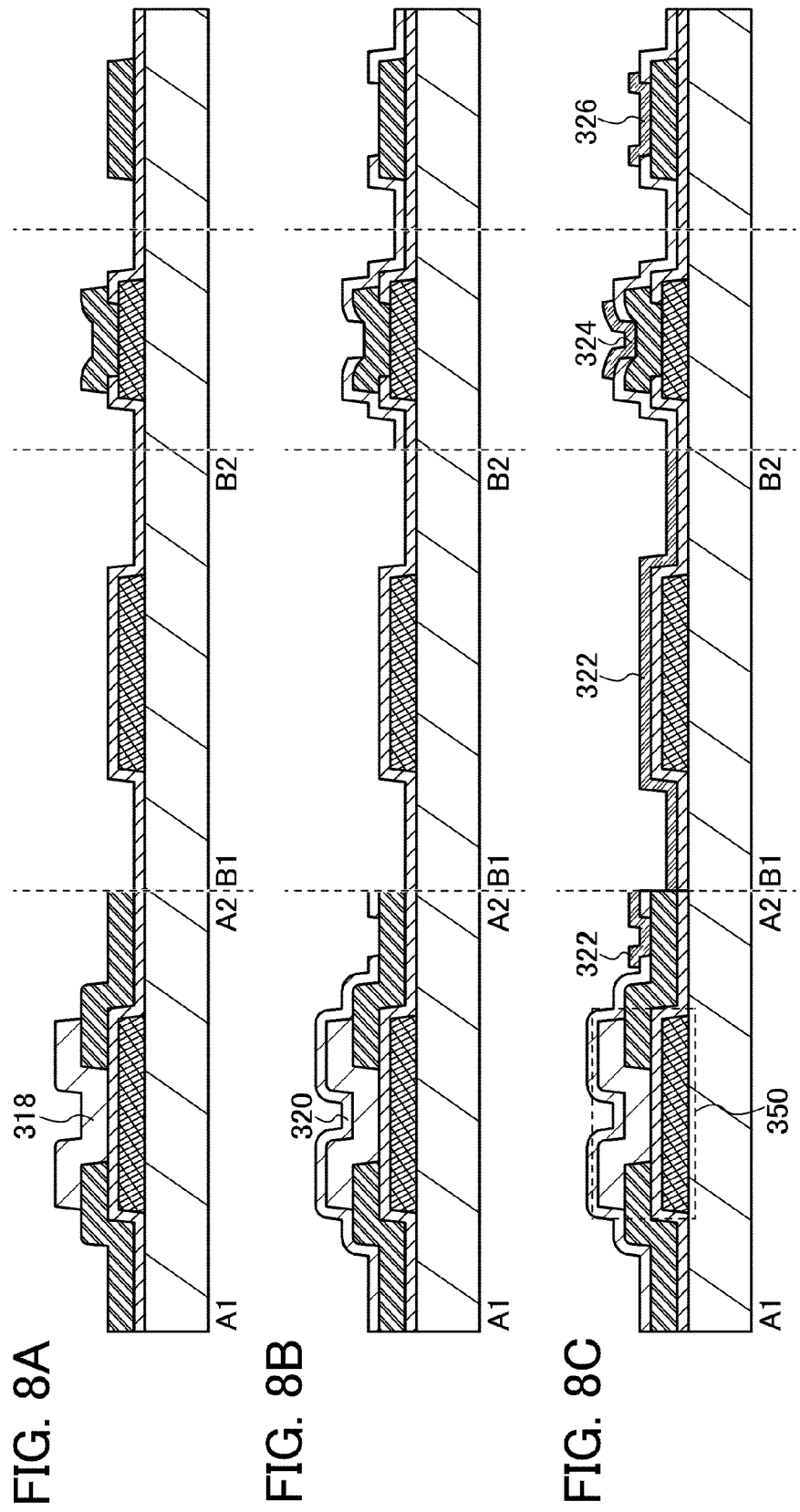

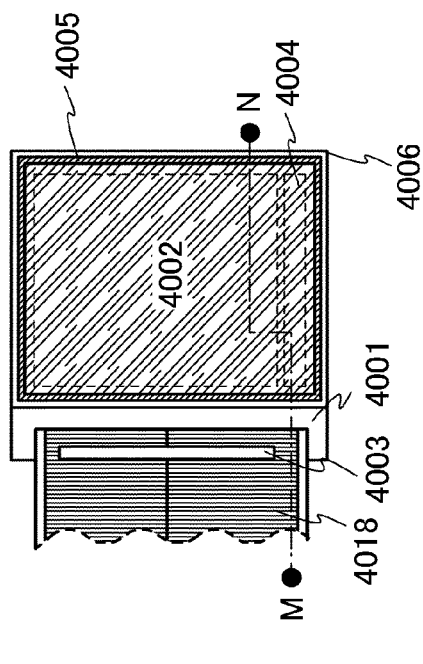
FIG. 10A1
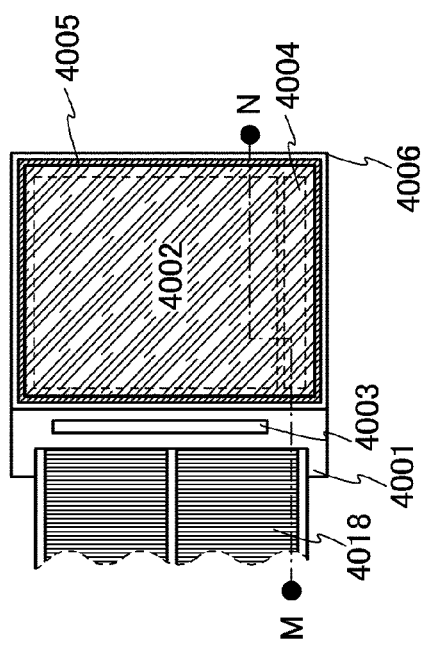
FIG. 10A2
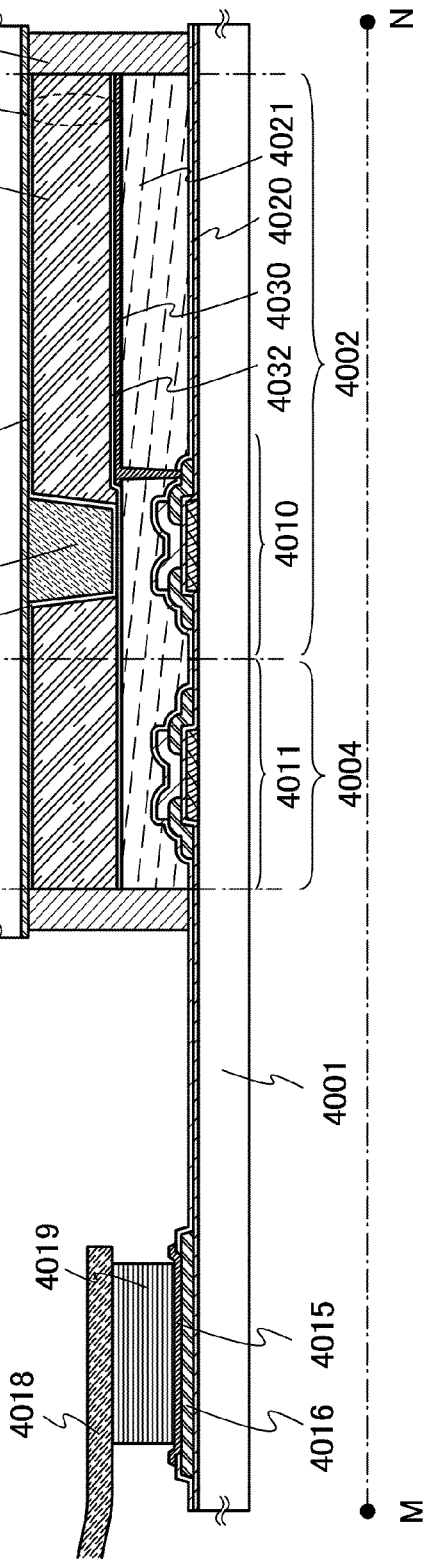
FIG. 10B

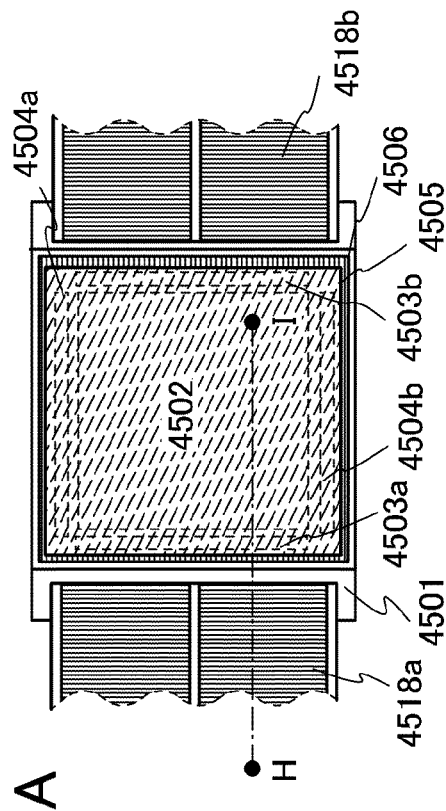
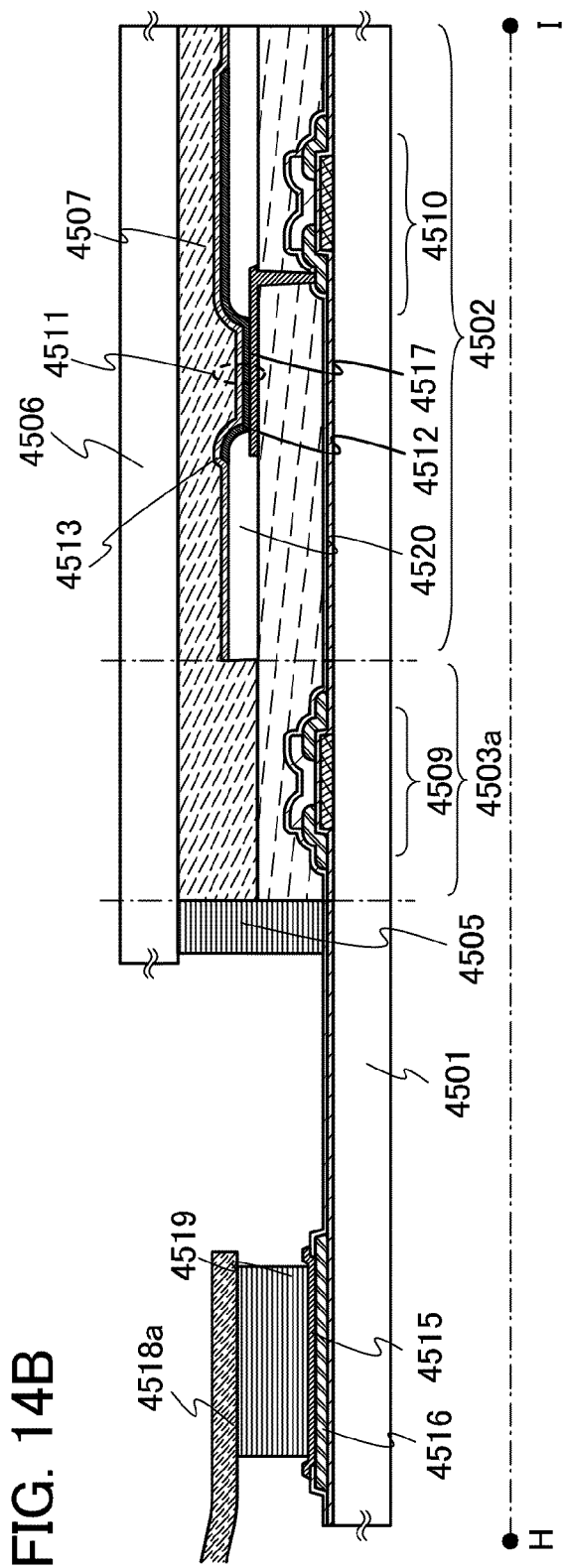
FIG. 14A
FIG. 14B

METHOD FOR MANUFACTURING SEMICONDUCTOR DEVICE INCLUDING STEP OF ADDING CATION TO OXIDE SEMICONDUCTOR LAYER

BACKGROUND OF THE INVENTION

1. Field of the Invention

The present invention relates to a method for manufacturing a semiconductor device including a semiconductor element using an oxide semiconductor. An embodiment of the disclosed invention relates to a method for manufacturing a semiconductor device including an oxide semiconductor element with favorable initial characteristics and small characteristic variation in the long term.

2. Description of the Related Art

There are a wide variety of metal oxides and such metal oxides are used for various applications. Indium oxide is a well-known material and is used as a transparent electrode material which is necessary for liquid crystal displays and the like.

Some metal oxides have semiconductor characteristics. The examples of such metal oxides having semiconductor characteristics are tungsten oxide, tin oxide, indium oxide, zinc oxide, and the like. A thin film transistor in which a channel formation region is formed using such metal oxides having semiconductor characteristics is known (for example, see Patent Documents 1 to 4, Non-Patent Document 1, and the like).

Further, not only single-component oxides but also multi-component oxides are known as metal oxides. For example, $InGaO_3(ZnO)_m$ (m is natural number) which is a homologous compound is known as a multi-component oxide containing In, Ga and Zn (for example, see Non-Patent Documents 2 to 4 and the like).

Furthermore, it is confirmed that an oxide semiconductor including such an In—Ga—Zn—O-based oxide is applicable to a channel layer of a thin film transistor (for example, see Patent Document 5, Non-Patent Documents 5 and 6, and the like).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652
[Non-Patent Document 2] M. Nakamura, N. Kimizuka, and T. Mohri, "The Phase Relations in the $In_2O_3$—$Ga_2ZnO_4$—$ZnO$ System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides $(InFeO_3(ZnO)_m)$ (m: natural number) and related compounds", *KOTAI BUTSURI (SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

SUMMARY OF THE INVENTION

As described above, an oxide semiconductor has been extensively researched; however, for its complex composition, the characteristics of the oxide semiconductor itself have not been elucidated. The present situation is that under these circumstances, a manufacturing condition by which a semiconductor element using an oxide semiconductor can have favorable characteristics has not been found. In particular, defects such as tendency to be normally-on and large variation in characteristics are seen notably. A cause of the tendency to be normally-on is a large number of carriers existing in an oxide semiconductor. Hydrogen, oxygen deficiency in an oxide semiconductor, and the like may cause the generation of carriers.

In view of the above-described problems, an object of an embodiment of the invention disclosed in this specification and the like (including at least the specification, the claims, and the drawings) is to provide a semiconductor device including an oxide semiconductor element whose characteristic variation is small in the long term. Another object of an embodiment is to obtain a normally-off oxide semiconductor element.

An embodiment of the present invention is to form a semiconductor element by adding a cation containing one or more elements selected from oxygen and halogen to an oxide semiconductor layer. In addition, the addition of a cation can also be performed on an insulating layer or an insulator which is in contact with the oxide semiconductor layer.

For example, an embodiment of the invention disclosed in this specification is a method for manufacturing a semiconductor device, comprising the steps of: forming a first conductive layer functioning as a gate electrode over a substrate; forming a first insulating layer covering the first conductive layer; forming an oxide semiconductor layer over the first insulating layer so that part of the oxide semiconductor layer overlaps with the first conductive layer; forming a second conductive layer electrically connected to the oxide semiconductor layer; forming a second insulating layer covering the oxide semiconductor layer and the second conductive layer; and adding a cation containing one or more elements selected from oxygen and halogen to the oxide semiconductor layer.

Note that the above-described oxide semiconductor layer preferably contains indium, gallium, and zinc.

In the above method, there is no particular limitation on a positional relation, a formation order, or the like of the oxide semiconductor layer and the second conductive layer. In the case where the second conductive layer has a layered structure, a structure may be employed in which the oxide semiconductor layer is sandwiched between layers of the second conductive layer.

In the above method, a step of performing heat treatment on the oxide semiconductor layer may be included. The heat treatment is preferably performed at a temperature higher than or equal to 100° C. and lower than or equal to 500° C., preferably higher than or equal to 200° C. and lower than or equal to 400° C. The heat treatment may be performed while the cation is being added. Thus, addition of hydrogen can be suppressed.

In the above method, the step of adding the cation to the oxide semiconductor layer is preferably performed at a stage when at least part of the oxide semiconductor layer is exposed.

In the above method, the cation containing one or more elements selected from oxygen and halogen is preferably added to the first insulating layer or the second insulating layer.

In the above method, the step of adding the cation is preferably performed by one selected from an electron cyclotron resonance (ECR) plasma method, a helicon wave plasma (HWP) method, an inductively coupled plasma (ICP) method, and a microwave-excited surface wave plasma (SWP) method; or a combination thereof because damage to an object to which the cation is added is small.

For example, another embodiment of the invention disclosed in this specification is a method for manufacturing a semiconductor device, comprising the steps of: forming an oxide semiconductor layer over an insulator; forming a first conductive layer electrically connected to the oxide semiconductor layer; forming an insulating layer covering the oxide semiconductor layer and the first conductive layer; forming a second conductive layer over the insulating layer so that part of the second conductive layer overlaps with the oxide semiconductor layer; and adding a cation containing one or more elements selected from oxygen and halogen to the oxide semiconductor layer.

Note that the above-described oxide semiconductor layer preferably contains indium, gallium, and zinc.

In the above method, there is no particular limitation on a positional relation, a formation order, or the like of the oxide semiconductor layer and the second conductive layer. In the case where the second conductive layer has a layered structure, a structure may be employed in which the oxide semiconductor layer is sandwiched between layers of the second conductive layer.

In the above method, a step of performing heat treatment on the oxide semiconductor layer may be included. The heat treatment is preferably performed at a temperature higher than or equal to 100° C. and lower than or equal to 500° C., preferably higher than or equal to 200° C. and lower than or equal to 400° C. The heat treatment may be performed while the cation is being added. Thus, addition of hydrogen can be suppressed.

In the above method, the step of adding the cation to the oxide semiconductor layer is preferably performed at a stage when at least part of the oxide semiconductor layer is exposed.

In the above method, a cation containing one or more elements selected from oxygen and halogen is preferably added to the insulator or the insulating layer.

In the above method, the step of adding the cation is preferably performed by one selected from an electron cyclotron resonance (ECR) plasma method, a helicon wave plasma (HWP) method, an inductively coupled plasma (ICP) method, and a microwave-excited surface wave plasma (SWP) method; or a combination thereof because damage to an object to which the cation is added is small.

Note that in this specification and the like, a semiconductor device means any device which can function by utilizing semiconductor characteristics; and a display device, a semiconductor circuit, and an electronic device are all included in the semiconductor devices.

According to an embodiment of the disclosed invention, a cation containing one or more elements selected from oxygen and halogen is added to an oxide semiconductor layer. By adding a cation containing oxygen, an oxygen deficiency portion in an oxide semiconductor can be reduced. Accordingly, the number of carriers can be reduced, so that a normally-off field effect transistor can be obtained. In addition, elimination of oxygen from the oxide semiconductor layer can be suppressed, so that a semiconductor device including an oxide semiconductor element whose characteristic variation is small in the long term can be provided.

The elimination of oxygen is not favorable because it causes oxygen deficiency in the oxide semiconductor and an increase of the number of carriers. In addition, in order to further suppress the elimination of oxygen, it is effective to add a cation containing oxygen to an insulating layer or an insulator which is in contact with the oxide semiconductor layer. Note that the above treatments also have an effect of suppressing characteristic variation of the semiconductor elements.

On the other hand, when a cation containing halogen is added to the oxide semiconductor layer, hydrogen can be eliminated or movement of hydrogen can be suppressed in advance, whereby the oxide semiconductor which is closer to intrinsic can be obtained. Accordingly, a normally-off field effect transistor can be obtained. It is preferable that a cation containing halogen be also added to the insulating layer or the insulator which is in contact with the oxide semiconductor layer because the entry of hydrogen from the outside into the oxide semiconductor layer can be suppressed.

As described above, according to an embodiment of the disclosed invention, a semiconductor device including a semiconductor element with favorable characteristics can be provided.

BRIEF DESCRIPTION OF THE DRAWINGS

In the accompanying drawings:

FIGS. 6A to 6D are cross-sectional views illustrating a method for manufacturing a semiconductor element used for a semiconductor device;

FIGS. 7A to 7C are cross-sectional views illustrating a method for manufacturing a semiconductor device;

FIGS. 8A to 8C are cross-sectional views illustrating the method for manufacturing the semiconductor device;

FIGS. 10A1, 10A2, and 10B illustrate semiconductor devices;

FIGS. 14A and 14B illustrate a semiconductor device;

DETAILED DESCRIPTION OF THE INVENTION

Figure 1A:
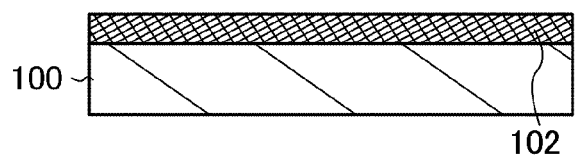
FIGS. 1A to 1E are cross-sectional views illustrating a method for manufacturing a semiconductor element used for a semiconductor device.

Embodiments will be described below in detail using drawings. Note that the present invention is not limited to the description of the embodiments, and it is apparent to those skilled in the art that modes and details can be modified in various ways without departing from the spirit of the present invention disclosed in this specification and the like. A structure and a method of the different embodiment can be implemented by combination appropriately. On the description of the invention with reference to the drawings, a reference numeral indicating the same part is used in common throughout different drawings, and the repeated description is omitted. In addition, the semiconductor device in this specification indicates all devices that operate by utilizing semiconductor characteristics.

Embodiment 1

In this embodiment, an example of a method for manufacturing a semiconductor element used for a semiconductor device is described with reference to drawings. In this specification, although first plasma treatment and second plasma treatment are disclosed, it is very important to perform the second plasma treatment. The first plasma treatment may be selectively performed as appropriate by practitioners in accordance with required specifications. Note that in this specification, the first plasma treatment is defined as treatment which is performed on an insulating layer or an insulator which is in contact with an oxide semiconductor layer, and the second plasma treatment is defined as treatment which is performed on the oxide semiconductor layer.

First, a conductive film 102 is formed over a substrate 100 (see FIG. 1A).

Any substrate can be used for the substrate 100 as long as it is a substrate having an insulating surface, for example, a glass substrate. Further, it is preferable that the glass substrate be an alkali-free glass substrate. As a material of the alkali-free glass substrate, a glass material such as aluminosilicate glass, aluminoborosilicate glass, barium borosilicate glass, or the like is used, for example. Besides, as the substrate 100, an insulating substrate formed of an insulator such as a ceramic substrate, a quartz substrate, or a sapphire substrate, a semiconductor substrate formed of a semiconductor material such as silicon, over which an insulating material is covered, a conductive substrate formed of a conductive material such as metal or stainless steel, over which an insulating material is covered can be used. In addition, a plastic substrate can be used as long as it can withstand heat treatment in a manufacturing process.

The conductive film 102 is preferably formed using a conductive material such as aluminum (Al), copper (Cu), molybdenum (Mo), tungsten (W), or titanium (Ti). As a formation method, a sputtering method, a vacuum evaporation, a plasma CVD method, and the like are given. In the case of using aluminum (or copper) for the conductive film 102, since aluminum itself (or copper itself) has disadvantages such as low heat resistance and a tendency to be corroded, it is preferably formed in combination with a conductive material having heat resistance.

As the conductive material having heat resistance, it is possible to use metal containing an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of these elements as its component, or the like. The conductive material having heat resistance and aluminum (or copper) may be stacked, whereby the conductive film 102 may be formed.

Although not shown in the drawings, a base layer may be provided over the substrate 100. The base layer has a function of preventing diffusion of an impurity from the substrate 100, such as an alkali metal (Li, Cs, Na, or the like), an alkaline earth metal (Ca, Mg, or the like), or the like. That is, provision of the base layer can achieve an object of improving the reliability of a semiconductor device. The base layer may be formed to have a single-layer structure or a layered structure using a variety of insulating materials such as silicon nitride or silicon oxide. Specifically, for example, a structure in which silicon nitride and silicon oxide are stacked in that order over the substrate 100 is favorable. This is because silicon nitride has a high blocking effect against an impurity. At the same time, in the case where silicon nitride is in contact with a semiconductor, there is a possibility that a problem occurs in the semiconductor element; thus, silicon oxide is preferably applied as a material to be in contact with the semiconductor.

Figure 1B:
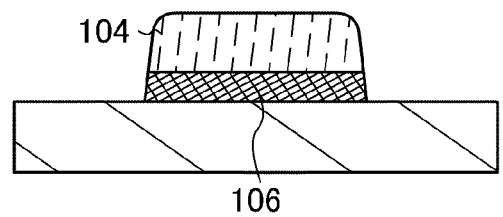

Next, a resist mask 104 is selectively formed over the conductive film 102 and the conductive film 102 is selectively etched using the resist mask 104, whereby a conductive layer 106 which functions as a gate electrode is formed (see FIG. 1B).

The resist mask 104 is formed through steps such as application of a resist material, light exposure using a photomask, and development. For the application of the resist material, a method such as a spin-coating method can be employed. Instead, the resist mask 104 may be selectively formed by a droplet discharging method, a screen printing method, or the like. In that case, the steps of light exposure using a photomask, development, and the like are not needed; therefore, improvement in productivity can be achieved. Note that the resist mask 104 is removed after the conductive layer 106 is formed by etching the conductive film 102.

As the above etching, dry etching may be used, or wet etching may be used. In order to improve coverage with and prevent disconnection of a gate insulating layer or the like which is formed later, the etching is preferably performed so that end portions of the conductive layer 106 are tapered. For example, the end portions are preferably tapered at a taper angle greater than or equal to 20° and less than 90°. Here, the "taper angle" refers to an acute angle formed by a side surface of a layer which is tapered to a bottom surface thereof when the layer having a tapered shape is observed from a cross-sectional direction.

Figure 1C:
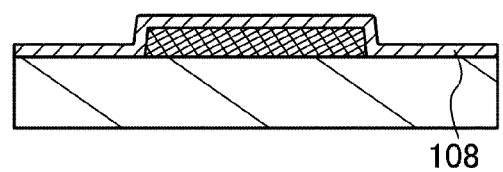

Next, an insulating layer 108 which functions as a gate insulating layer is formed to cover the conductive layer 106 (see FIG. 1C). The insulating layer 108 can be formed using a material such as silicon oxide, silicon oxynitride, silicon nitride, silicon nitride oxide, aluminum oxide, or tantalum oxide. The insulating layer 108 may also be formed by stacking films formed of these materials. These films are preferably formed to a thickness greater than or equal to 5 nm and less than or equal to 250 nm by a sputtering method or the like. For example, as the insulating layer 108, a silicon oxide film can be formed to a thickness of 100 nm by a sputtering method.

While the method for forming the insulating layer 108 is not particularly limited as long as the predetermined insulating layer 108 can be obtained, the effect of hydrogen, nitrogen, or the like in the film needs to be taken into consideration in the case where the insulating layer 108 is formed using another method (such as a plasma CVD method). For example, the insulating layer 108 is formed so that the hydrogen concentration and nitrogen concentration therein are lower than those in an oxide semiconductor layer to be formed later. More specifically, the hydrogen concentration in the insulating layer 108 may be $1 \times 10^{21}$ atoms/cm$^3$ or less (preferably $5 \times 10^{20}$ atoms/cm$^3$ or less); the nitrogen concentration in the insulating layer 108 may be $1 \times 10^{19}$ atoms/cm$^3$ or less. Note that in order to obtain the insulating layer 108 which has favorable characteristics, the temperature of the deposition is preferably 400° C. or lower; however, an embodiment of the disclosed invention is not limited to this. Further, the concentrations which are described above show the average values in the insulating layer 108.

Alternatively, the insulating layer 108 with a layered structure may be formed by combination of a sputtering method and a CVD method (a plasma CVD method or the like). For example, a lower layer of the insulating layer 108 (a region in contact with the conductive layer 106) is formed by a plasma CVD method and an upper layer of the insulating layer 108 can be formed by a sputtering method. Since a film with favorable step coverage is easily formed by a plasma CVD method, it is suitable for a method for forming a film just above the conductive layer 106. In the case of using a sputtering method, since it is easy to reduce hydrogen concentration in the film as compared to the case of using a plasma CVD method, by providing a film by a sputtering method in a region in contact with the oxide semiconductor layer, the hydrogen in the insulating layer 108 can be prevented from being diffused into the oxide semiconductor layer. Since the influence of hydrogen existing in the oxide semiconductor layer or in the vicinity thereof upon semiconductor characteristics is extremely large, it is effective to employ such a structure.

In this specification, an oxynitride refers to a substance that contains oxygen and nitrogen so that the content (the number of atoms) of oxygen is higher (larger) than that of nitrogen. For example, silicon oxynitride is a substance containing oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. A nitride oxide refers to a substance that contains oxygen and nitrogen so that the content (the number of atoms) of nitrogen is higher (larger) than that of oxygen. For example, a silicon nitride oxide is a substance containing oxygen, nitrogen, silicon, and hydrogen in ranges of 5 at. % to 30 at. %, 20 at. % to 55 at. %, 25 at. % to 35 at. %, and 10 at. % to 25 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total of the percentages of the constituent elements does not exceed 100 at. %.

Subsequently, the first plasma treatment is performed on the insulating layer 108. The treatment is performed in such a manner that plasma containing oxygen, halogen, or two or more elements of these is generated. As a method for generating plasma, an electron cyclotron resonance (ECR) plasma method, a helicon wave plasma (HWP) method, an inductively coupled plasma (ICP) method, a microwave-excited surface wave plasma (SWP) method, or the like can be used. In these methods, control of ion flux by an electric discharge power and control of ion energy by a bias power can be performed independently, so that a high electron density approximately higher than or equal to $1 \times 10^{11}$ ions/cm$^3$ and lower than or equal to $1 \times 10^{13}$ ions/cm$^3$ can be obtained. In that case, since a negative bias is applied to the substrate 100, an ion introduced to the insulating layer 108 is only a cation. Typically, an oxygen ion such as $O^+$, $O^{2+}$, $O^{3+}$, $O^{4+}$, $O^{5+}$, or $O^{6+}$; a chlorine ion such as $Cl^+$, $Cl_2^+$, $Cl^{3+}$, $Cl^{4+}$, $Cl^{5+}$, $Cl^{6+}$, or $Cl^{7+}$; a fluorine ion such as $F^+$, $F^{2+}$, $F^{3+}$, $F^{4+}$, $F^{5+}$, $F^{6+}$, or $F^{7+}$; or the like is implanted into the insulating layer 108.

When the energy of plasma is increased, not only a cation with a low valence but also a cation with a high valence is generated. When the cation with a high valence is implanted into the insulating layer 108, the cation has higher energy. Therefore, the cation with a high valence is added into a deeper position from a surface of the insulating layer 108 than the cation with a low valence. The depth is almost proportional to the valence. Accordingly, the cation is added to the insulating layer 108 with uniform distribution, which is preferable. Specifically, when a distribution having a peak of a cation with a valence of 1 at a depth of around d is formed, a peak of a cation with a valence of 2 is formed at a depth of around 2d. In a similar manner, as the valence is increased to 3, 4, or more, the position of the peak is deeper as 3d, 4d, or more. In addition, as the position of the peak is deeper, the distribution is expanded. Accordingly, for example, in the case of d=10 nm, it is preferable that plasma including a cation with a valence of 2 or more or preferably 4 or more be formed and added to the insulating layer 108 with a thickness of 50 nm. In the case of the insulating layer 108 with a thickness of 70 nm, it is preferable that plasma including a cation with a valence of 3 or more or preferably 6 or more be formed and the cation be added. A relational expression between a thickness t of a layer to which a cation is added and the valence n of a cation which is preferably contained is described below:

$$n=[t/2d], \text{ preferably } n=2\times[t/2d].$$

Note that [x] indicates a maximum integer which does not exceed x.

In order to generate a cation with such a high valence, an electron temperature of the plasma may be higher than or equal to 5 eV and lower than or equal to 100 eV. In addition, it is preferable that a substrate temperature be higher than or equal to 100° C. and lower than or equal to 500° C. at the time when a cation is added because the amount of hydrogen which is added at the same time can be reduced. This is because as the substrate temperature is higher, hydrogen is remarkably eliminated from the insulating layer 108. However, a high substrate temperature of 500° C. or higher is not preferable because such a high substrate temperature impairs an advantage that an oxide semiconductor element can be manufactured at a low temperature. After the heat treatment, a step of accelerating a cooling speed may be performed. Note that the first plasma treatment may be performed at room temperature (defined as 25° C. in this specification), or may be performed at a temperature lower than room temperature.

In this embodiment, an inductively coupled plasma (ICP) method is employed for the first plasma treatment. An example of recommended treatment conditions is as follows: the power for ICP is greater than or equal to 100 W and less than or equal to 2000 W, the power applied to a lower electrode provided on a substrate side is greater than or equal to 0 W and less than or equal to 300 W, the treatment time is greater than or equal to 10 seconds and less than or equal to 100 seconds, the inside pressure of a treatment chamber is greater than or equal to 0.1 Pa and less than or equal to 100 Pa, the oxygen ($O_2$) flow rate is greater than or equal to 10 sccm and less than or equal to 500 sccm, the temperature of the lower electrode is higher than or equal to −20° C. and lower than or equal to 500° C., and the RF power source frequency of ICP is 13.56 MHz. Note that the temperature of the lower electrode is conducted to the substrate; therefore, the temperature of the lower electrode is set so that the substrate temperature does not exceed 500° C. In addition, when power is applied to the lower electrode, the recommended RF power source frequency applied to the lower electrode is 3.2 MHz or 13.56 MHz. Note that halogen such as fluorine or chlorine may be used instead of oxygen ($O_2$) at the same or approximately the same flow rate. Alternatively, a gas containing two or more elements of these elements may be used.

Figure 1D:
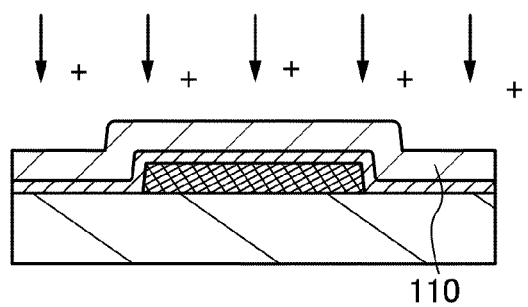

Next, an oxide semiconductor film 110 is formed to cover the insulating layer 108 (see FIG. 1D). In this embodiment, a metal oxide semiconductor material is used for the oxide semiconductor film 110.

The oxide semiconductor layer includes at least one element selected from In, Ga, Sn, Zn, Al, Mg, Hf and lanthanoid. For example, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an Al—Ga—Zn—O-based oxide semiconductor, or a Sn—Al—Zn—O-based oxide semiconductor, an In—Hf—Zn—O-based oxide semiconductor, an In—La—Zn—O-based oxide semiconductor, an In—Ce—Zn—O-based oxide semiconductor, an In—Pr—Zn—O-based oxide semiconductor, an In—Nd—Zn—O-based oxide semiconductor, an In—Pm—Zn—O-based oxide semiconductor, an In—Sm—Zn—O-based oxide semiconductor, an In—Eu—Zn—O-based oxide semiconductor, an In—Gd—Zn—O-based oxide semiconductor, an In—Tb—Zn—O-based oxide semiconductor, an In—Dy—Zn—O-based oxide semiconductor, an In—Ho—Zn—O-based oxide semiconductor, an In—Er—Zn—O-based oxide semiconductor, an In—Tm—Zn—O-based oxide semiconductor, an In—Yb—Zn—O-based oxide semiconductor, or an In—Lu—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like can be used. In addition, any of the above oxide semiconductors may contain an element other than In, Ga, Sn, Zn, Al, Mg, Hf and lanthanoid, for example, $SiO_2$.

For example, an In—Ga—Zn—O-based oxide semiconductor means an oxide semiconductor containing indium (In), gallium (Ga), and zinc (Zn), and there is no limitation on the composition ratio thereof.

As an example of the above oxide semiconductor material, one represented by $InMO_3(ZnO)_m$ (m>0) is given. Here, M denotes one or more of metal elements selected from zinc (Zn), gallium (Ga), iron (Fe), nickel (Ni), manganese (Mn), and cobalt (Co) and the like. For example, the case where Ga is selected as M includes the case where the above metal element except Ga is also selected such as a combination of Ga and Ni, or a combination of Ga and Fe as well as the case where only Ga is used. Moreover, in the above oxide semiconductor, in some cases, a transition metal element such as Fe or Ni or an oxide of the transition metal is contained as an impurity element in addition to a metal element contained as M. Needless to say, the oxide semiconductor material is not limited to the above materials and a variety of oxide semiconductor materials such as zinc oxide or indium oxide can be used.

In the case where the oxide semiconductor film 110 is formed using an In—Ga—Zn—O-based material as the oxide semiconductor material, for example, a sputtering method using an oxide semiconductor target containing In, Ga, and Zn ($In_2O_3:Ga_2O_3:ZnO=1:1:1$) can be employed. The sputtering can be performed under the following conditions, for example: the distance between the substrate 100 and the target is 30 mm to 500 mm; the pressure is 0.1 Pa to 2.0 Pa; the direct current (DC) power supply is 0.25 kW to 5.0 kW; the temperature is 20° C. to 100° C.; the atmosphere is a rare gas atmosphere such as argon, an oxide atmosphere, or a mixed atmosphere of a rare gas such as argon and oxide. As the above sputtering method, an RF sputtering method using a high frequency power supply for a power supply for sputtering, a DC sputtering method using a DC power supply, a pulsed DC sputtering method in which a DC bias is applied in a pulsed manner or the like can be employed.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

In this embodiment, the case of forming the oxide semiconductor film 110 using a single layer is described; however, the oxide semiconductor film 110 may be formed with a layered structure. For example, instead of the above structure, an oxide semiconductor film (hereinafter called an "oxide semiconductor film with normal conductivity") having the same composition as the oxide semiconductor film 110 is formed over the insulating layer 108, and after that, an oxide semiconductor film (hereinafter called an "oxide semiconductor film with high conductivity") having constituent elements which are the same as those of the oxide semiconductor film 110 and having a composition ratio thereof which is different from that of the oxide semiconductor film 110 is formed. In that case, since the oxide semiconductor film with high conductivity is provided between a source electrode (or a drain electrode) and the oxide semiconductor film with normal conductivity, element characteristics can be improved.

The oxide semiconductor film with normal conductivity and the oxide semiconductor film with high conductivity can be formed by making deposition conditions thereof different. In this case, it is preferable that a flow rate ratio of an oxygen gas to an argon gas in the deposition conditions of the oxide semiconductor film with high conductivity be smaller than that in the deposition conditions of the oxide semiconductor film with normal conductivity. More specifically, the oxide semiconductor film with high conductivity is formed in a rare gas (such as argon or helium) atmosphere or an atmosphere containing an oxygen gas at 10% or less and a rare gas at 90% or more. The oxide semiconductor film with normal conductivity is formed in an oxygen atmosphere or an atmosphere in which a flow rate of an oxygen gas is 1 time or more that of a rare gas. In such a manner, two kinds of oxide semiconductor films having different conductivities can be formed.

Further, after the plasma treatment is performed, when the oxide semiconductor film 110 is formed without exposure to the air, the attachment of dust or moisture to an interface between the insulating layer 108 and the oxide semiconductor film 110 can be prevented.

Note that, the oxide semiconductor film 110 may have a thickness of approximately 5 nm to 200 nm.

Subsequently, the second plasma treatment is performed on the oxide semiconductor film 110. A symbol "+" in FIG. 1D denotes a cation. The second plasma treatment can be performed using a method similar to that of the first plasma treatment. Note that the second plasma treatment may be performed at a stage when the oxide semiconductor film 110 is exposed; therefore, the treatment is not necessarily performed at this stage. The plasma treatment can dramatically improve characteristics of the semiconductor elements and reduce variation in the characteristics.

In the case where the oxide semiconductor film 110 is formed with a multi-layer structure including m layers, the second plasma treatment may be performed, for example, at a timing after deposition of any of a first layer to an (m−1)-th layer. Further, after heat treatment in the second plasma treatment, a step of accelerating a cooling speed may be performed. Note that the second plasma treatment may be performed at room temperature or a temperature lower than room temperature.

Figure 1E:
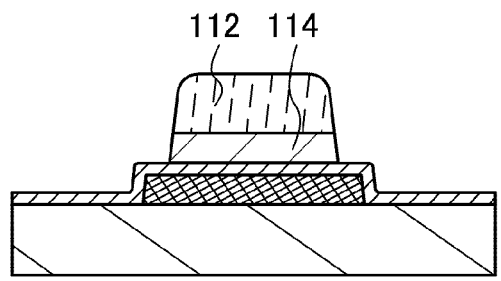

Next, a resist mask 112 is selectively formed over the oxide semiconductor film 110 and the oxide semiconductor film 110 is selectively etched using the resist mask 112, whereby an oxide semiconductor layer 114 is formed (see FIG. 1E). Here, the resist mask 112 can be formed in a method similar to the resist mask 104. After the semiconductor layer 114 is formed by etching the oxide semiconductor film 110, the resist mask 112 is removed.

Wet etching or dry etching can be used for the etching of the oxide semiconductor film 110. Here, an unnecessary portion of the oxide semiconductor film 110 is removed by wet etching using a mixed solution of acetic acid, nitric acid, and phosphoric acid, so that the oxide semiconductor layer 114 is formed. Note that an etchant (an etching solution) for the wet etching is not limited to the above solution as long as the oxide semiconductor film 110 can be etched.

In the case of using dry etching, for example, a gas containing a chlorine atom (such as chlorine ($Cl_2$) or chlorine dioxide ($ClO_2$)) or a gas containing a chlorine atom to which oxygen ($O_2$) is added is preferably used. This is because by using a gas containing a chlorine atom, etching selectivity of the oxide semiconductor film 110 with respect to the conductive layer or the base layer can be easily obtained.

As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. Alternatively, a technique similar to the above methods may be used.

Figure 2A:
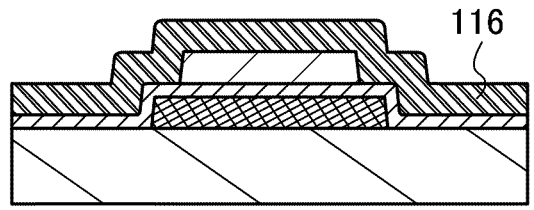
FIGS. 2A to 2D are cross-sectional views illustrating the method for manufacturing the semiconductor element used for the semiconductor device.

Next, a conductive film 116 is formed to cover the insulating layer 108 and the oxide semiconductor layer 114 (see FIG. 2A). The conductive film 116 can be formed using a material and a method which are similar to those of the conductive film 102. For example, the conductive film 116 can be formed to have a single-layer structure of a molybdenum film or a titanium film. Alternatively, the conductive film 116 may be formed to have a layered structure and can have a layered structure of an aluminum film and a titanium film, for example. A three-layer structure in which a titanium film, an aluminum film, and a titanium film are sequentially stacked may be used. A three-layer structure in which a molybdenum film, an aluminum film, and a molybdenum film are sequentially stacked may be used. As the aluminum films used for these layered structures, an aluminum film including neodymium (Al—Nd) may be used. Further alternatively, the conductive film 116 may have a single-layer structure of an aluminum film containing silicon.

Figure 2B:
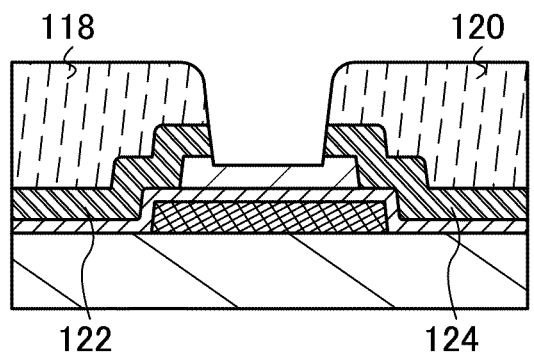

Next, a resist mask 118 and a resist mask 120 are selectively formed over the conductive film 116 and the conductive film 116 is selectively etched using the resist masks to form a conductive layer 122 which functions as one of source and drain electrodes and a conductive layer 124 which functions as the other of the source and drain electrodes (see FIG. 2B). Here, the resist mask 118 and the resist mask 120 can be formed in a method similar to that of the resist mask 104. Note that the resist mask 118 and the resist mask 120 are removed after the conductive layer 122 and the conductive layer 124 are formed by etching the conductive film 116.

The resist mask 118 may be formed using a multi-tone mask. Here, the multi-tone mask is a mask capable of light exposure with multi-level light intensity. With the use of a multi-tone mask, one-time exposure and development process allow a resist mask with plural thicknesses (typically, two kinds of thicknesses) to be formed. By use of the multi-tone mask, the number of steps can be suppressed.

Either wet etching or dry etching can be employed as a method for etching the conductive film 116. Here, an unnecessary portion of the conductive film 116 is removed by dry etching to form the conductive layer 122 and the conductive layer 124.

Note that, although a structure (a channel etch type) in which part of the oxide semiconductor layer 114 is removed when the conductive film 116 is etched is employed in this embodiment, an embodiment of the disclosed invention is not limited to this structure. Instead, another structure (an etching stopper type) can be employed in which a layer (an etching stopper) which prevents the etching from proceeding is formed between the oxide semiconductor layer 114 and the conductive film 116, so that the oxide semiconductor layer 114 is not etched.

After the conductive layer 122 and the conductive layer 124 are formed, heat treatment is performed at 100° C. to 500° C., typically 200° C. to 400° C. The atmosphere of the heat treatment can be, for example, an air atmosphere, a nitrogen atmosphere, an oxygen atmosphere, or the like. Further, the heat treatment time can be about 0.1 to 5 hours. Here, the heat treatment at 350° C. for one hour in an air atmosphere is performed. Note that the timing of the heat treatment is not particularly limited as long as it is after the oxide semiconductor film 110 is formed and before an insulating layer serving as an interlayer insulating layer is formed. For example, the heat treatment may be performed just after the oxide semiconductor film 110 is formed. Alternatively, the heat treatment may be performed just after the oxide semiconductor layer 114 is formed or just after the conductive film 116 is formed. By performing the heat treatment (the first heat treatment) and the following heat treatment (second heat treatment), the characteristics of the semiconductor elements can be improved and variation in the characteristics can be reduced.

Note that it is preferable that the above-described heat treatment be performed at 400° C. or lower so as not to change (deteriorate) the characteristics of the insulating layer 108 which functions as the gate insulating layer. Needless to say, an embodiment of the disclosed invention should not be interpreted as being limited thereto.

Figure 2C:
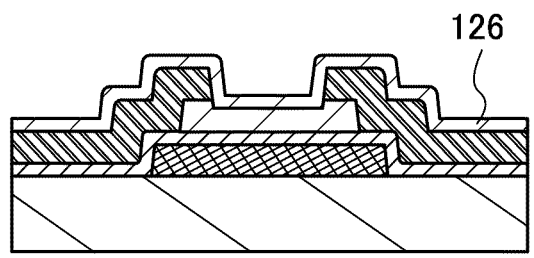

Next, an insulating layer 126 is formed to cover the conductive layer 122, the conductive layer 124, the oxide semiconductor layer 114, and the like (see FIG. 2C). Here, the insulating layer 126 serves as a so-called interlayer insulating layer. The insulating layer 126 can be formed using a material such as silicon oxide, aluminum oxide, or tantalum oxide. The insulating layer 126 may also be formed by stacking films formed of these materials.

The hydrogen concentration in the insulating layer 126 is preferably $1\times10^{21}$ atoms/cm$^3$ or less (in particular, $5\times10^{20}$ atoms/cm$^3$ or less). In addition, the nitrogen concentration in the insulating layer 126 is preferably $1\times10^{19}$ atoms/cm$^3$ or less. Note that the above concentrations show the average values in the insulating layer 126.

As a more specific example of the insulating layer 126 satisfying the above-described condition, a silicon oxide film formed by a sputtering method can be given. This is because, in the case of using a sputtering method, it is easy to reduce the hydrogen concentration in the film as compared to the case of using a plasma CVD method. Needless to say, any of other methods including a plasma CVD method may be employed as long as the above-described condition is satisfied. For example, the hydrogen concentration in the film can be reduced in such a manner that the insulating layer 126 is formed by a plasma CVD method and then plasma treatment similar to that performed on the insulating layer 108 is performed on the insulating layer 126. The other conditions of the insulating layer 126 are not particularly limited. For example, the thickness of the insulating layer 126 may vary within a feasible range.

Figure 2D:
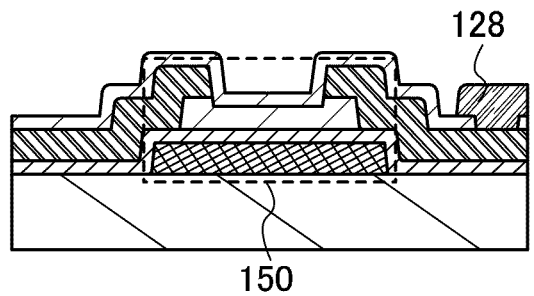

After that, a variety of electrodes and wirings are formed, whereby a semiconductor device provided with a transistor 150 is completed (see FIG. 2D). In this embodiment, a typical example is described in which a conductive layer 128 functioning as a pixel electrode of a display device is formed. However, an embodiment of the disclosed invention is not limited thereto.

After the conductive layer 128 is formed, heat treatment is performed at 100° C. to 500° C., typically, 200° C. to 400° C. The atmosphere in which the heat treatment is performed can be, for example, an air atmosphere, a nitrogen atmosphere, an oxygen atmosphere, or the like. Further, the heat treatment time can be about 0.1 to 5 hours. Here, the heat treatment at 350° C. for one hour in an air atmosphere is performed. Note that the timing of the heat treatment is not particularly limited as long as it is after the formation of the insulating layer 126. For example, the above heat treatment may be performed just after the insulating layer 126 is formed or after another insulating layer, conductive layer, or the like is formed. By performing the heat treatment (the second heat treatment) and the preceding heat treatment (the first heat treatment), the characteristics of the semiconductor elements can be improved and variation in the characteristics can be reduced.

Note that the effect of the second heat treatment is not limited to the above. For example, the second heat treatment also provides an advantageous effect of repairing defects in the insulating layer 126. Since the insulating layer 126 is formed at a relatively low temperature, defects exist in the film. The element characteristics might be adversely affected when the insulating layer 126 is used as it is. From a perspective of repairing such defects in the insulating layer 126, it can be said that the above-described heat treatment plays an important role.

In addition, it is preferable that the heat treatment be performed at 400° C. or lower so as not to change (deteriorate) the characteristics of the insulating layer 108 which functions as the gate insulating layer. Needless to say, an embodiment of the disclosed invention should not be interpreted as being limited thereto.

As described in this embodiment, by performing plasma treatment on the oxide semiconductor film 110 with the use of a cation, the oxide semiconductor element having excellent characteristics can be provided. When the insulating layer 108 and/or the insulating layer 126 in contact with the oxide semiconductor film 110 are/is subjected to the treatment, the semiconductor element with higher reliability can be obtained. Accordingly, a semiconductor device including an oxide semiconductor element with excellent characteristics can be provided.

This embodiment can be combined with any of the other embodiments as appropriate.

Embodiment 2

In this embodiment, an example which is different from the above embodiment of a method for manufacturing a semiconductor element used for a semiconductor device is described with reference to drawings. Note that many parts of a method for manufacturing a semiconductor device in this embodiment are the same as those in the above embodiment. Therefore, in the following description, repeated description of the same portions is omitted, and different points are described in detail.

Figure 3A:
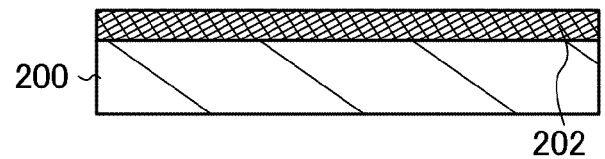
FIGS. 3A to 3E are cross-sectional views illustrating a method for manufacturing a semiconductor element used for a semiconductor device.

First, a conductive film 202 is formed over a substrate 200 (see FIG. 3A). The above embodiment (the description with reference to FIG. 1A or the like) can be referred to for the details of the substrate 200, the conductive film 202, or the like. A base layer may be formed over the substrate 200. The above embodiment can also be referred to for the detail of the base layer.

Figure 3B:
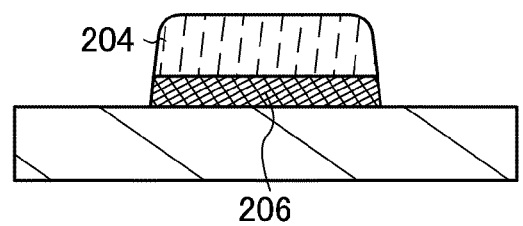

Next, a resist mask 204 is selectively formed over the conductive film 202 and the conductive film 202 is selectively etched using the resist mask 204, whereby a conductive layer 206 which functions as a gate electrode is formed (see FIG. 3B). The above embodiment (the description with reference to FIG. 1B or the like) can be referred to for the details of the resist mask 204, the conductive layer 206, the etching, or the like.

Figure 3C:
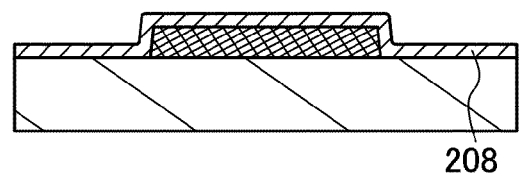

Then, an insulating layer 208 which functions as a gate insulating layer is formed so as to cover the conductive layer 206 (see FIG. 3C). The above embodiment (the description with reference to FIG. 1C or the like) can be referred to for the detail of the insulating layer 208 or the like.

Subsequently, treatment which is similar to the first plasma treatment described in Embodiment 1 is performed. The plasma treatment may be performed at a stage when at least part of the insulating layer 208 is exposed; therefore, the plasma treatment is not necessarily performed at this stage. The plasma may be generated by a microwave. A frequency at this time is 2.45 GHz, for example.

Figure 3D:
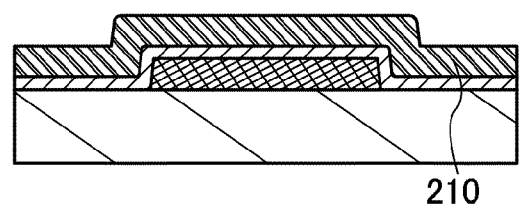

Next, a conductive film 210 is formed to cover the insulating layer 208 (see FIG. 3D). The conductive film 210 can be formed using a material and a method which are similar to those of the conductive film 202. In other words, the above embodiment (the description with reference to FIG. 1A and FIG. 2A or the like) can be referred to for the details.

Figure 3E:
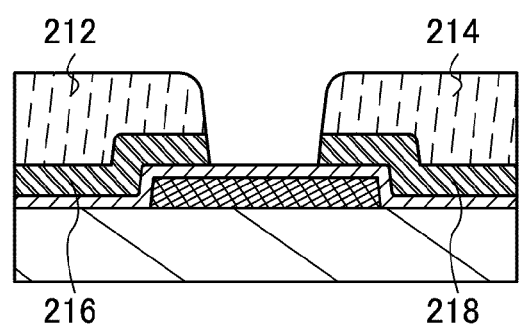

Next, a resist mask 212 and a resist mask 214 are selectively formed over the conductive film 210 and the conductive film 210 is selectively etched using the resist masks to form a conductive layer 216 which functions as one of source and drain electrodes and a conductive layer 218 which functions as the other of the source and drain electrodes (see FIG. 3E). Here, the resist mask 212 and the resist mask 214 can be formed in manner similar to the resist mask 204. In other words, the above embodiment (the description with reference to FIG. 1B and FIG. 2B or the like) can be referred to for the details of the resist masks.

Either wet etching or dry etching can be employed as a method for etching the conductive film 210. Here, an unnecessary portion of the conductive film 210 is removed by dry etching to form the conductive layer 216 and the conductive layer 218. Note that although not illustrated in this embodiment, part of the insulating layer 208 is removed by the etching in some cases.

Figure 4A:
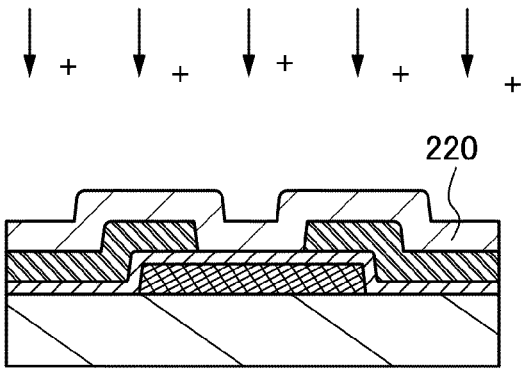
FIGS. 4A to 4D are cross-sectional views illustrating the method for manufacturing the semiconductor element used for the semiconductor device.

Next, an oxide semiconductor film 220 is formed to cover the insulating layer 208, the conductive layer 216, the conductive layer 218, and the like (see FIG. 4A). The above embodiment (the description with reference to FIG. 1D or the like) can be referred to for the detail of the oxide semiconductor film 220.

Subsequently, treatment which is similar to the second plasma treatment described in Embodiment 1 is performed. A symbol "+" in FIG. 4A denotes a cation. The plasma treatment is performed at a stage when at least part of the oxide semiconductor film 220 is exposed; therefore, the treatment is not necessarily performed at this stage. The plasma may be generated by a microwave. A frequency at this time is 2.45 GHz, for example.

Figure 4B:
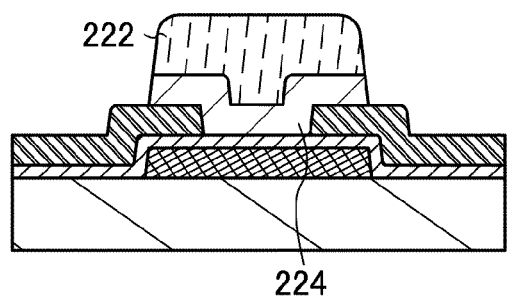

Next, a resist mask 222 is selectively formed over the oxide semiconductor film 220 and the oxide semiconductor film 220 is selectively etched using the resist mask 222 to form an oxide semiconductor film 224 (see FIG. 4B). The above embodiment (the description with reference to FIGS. 1B and 1E or the like) can be referred to for the detail of the resist mask 222.

Either wet etching or dry etching can be employed as a method for etching the oxide semiconductor film 220. Here, an unnecessary portion of the oxide semiconductor film 220 is removed by wet etching using a mixed solution of acetic acid, nitric acid, and phosphoric acid, so that the oxide semiconductor film 224 is formed. Note that an etchant (an etchant solution) used for the wet etching is not limited to the above solution as long as the oxide semiconductor film 220 can be etched using the etchant.

In the case of dry etching, for example, a gas containing a chlorine atom (such as chlorine ($Cl_2$) or chlorine dioxide ($ClO_2$)) or a gas containing a chlorine atom to which oxygen ($O_2$) is added is preferably used. This is because by using a gas including a chlorine atom, etching selectivity of the oxide semiconductor film 220 with respect to the conductive layer or the base layer can be easily obtained. Note that the above embodiment can be referred to for the detail of the etching or the like.

After the oxide semiconductor film 224 is formed, heat treatment at 100° C. to 500° C., typically 200° C. to 400° C., is performed. The atmosphere of the heat treatment can be, for example, an air atmosphere, a nitrogen atmosphere, an oxygen atmosphere, or the like. Further, the heat treatment time can be about 0.1 to 5 hours. Here, the heat treatment at 350° C. for one hour in an air atmosphere is performed. Note that the timing of the heat treatment is not particularly limited as long as it is after the oxide semiconductor film 220 is formed and before an insulating layer serving as an interlayer insulating layer is formed. For example, the above heat treatment may be performed just after the oxide semiconductor film 220 is formed. By performing the heat treatment (the first heat treatment) and the following heat treatment (the second heat treatment), the characteristics of the semiconductor elements can be improved and variation in the characteristics can be reduced.

Note that it is preferable that the heat treatment be performed at 400° C. or lower so as not to change (deteriorate) the characteristics of the insulating layer 208 which functions as the gate insulating layer. Needless to say, an embodiment of the disclosed invention should not be interpreted as being limited thereto.

Figure 4C:
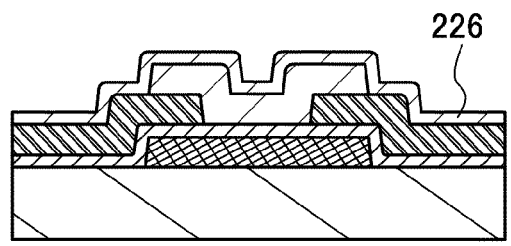

Next, an insulating layer 226 is formed to cover the conductive layer 216, the conductive layer 218, the oxide semiconductor film 224, and the like (see FIG. 4C). Here, the insulating layer 226 serves as a so-called interlayer insulating layer. The insulating layer 226 can be formed using a material such as silicon oxide, aluminum oxide, or tantalum oxide. The insulating layer 226 may also be formed by stacking films formed of these materials.

Subsequently, treatment which is similar to the first plasma treatment described in Embodiment 1 is performed. The plasma treatment may be performed at a stage when at least part of the insulating layer 226 is exposed; therefore, the plasma treatment is not necessarily performed at this stage.

The hydrogen concentration in the insulating layer 226 is preferably $1\times10^{21}$ atoms/cm$^3$ or less (in particular $5\times10^{20}$ atoms/cm$^3$ or less). In addition, the nitrogen concentration in the insulating layer 226 is preferably $1\times10^{19}$ atoms/cm$^3$ or less. Note that the above concentrations show the average values in the insulating layer 226.

As a more specific example of the insulating layer 226, which satisfies the above-described condition, a silicon oxide film formed by a sputtering method can be given. This is because, in the case of using a sputtering method, it is easy to reduce hydrogen concentration in the film as compared with the case of using a plasma CVD method. Needless to say, any of other methods including a plasma CVD method may be employed as long as the above-described condition is satisfied. For example, the hydrogen concentration in the film can be reduced in such a manner that the insulating layer 226 is formed by a plasma CVD method and then plasma treatment similar to that performed on the insulating layer 108 described in Embodiment 1 is performed on the insulating layer 226. The other conditions of the insulating layer 226 are not particularly limited. For example, the thickness of the insulating layer 226 may vary within a feasible range.

Figure 4D:
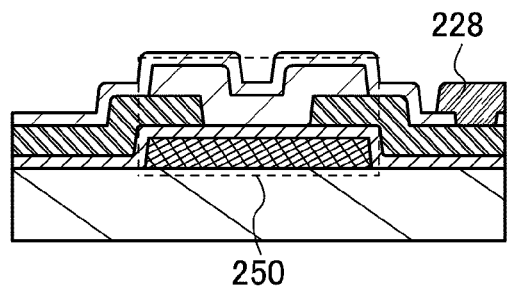

After that, a variety of electrodes and wirings are formed, whereby a semiconductor device provided with a transistor 250 is completed (see FIG. 4D). In this embodiment, a typical example is described in which a conductive layer 228 which functions as a pixel electrode of a display device is formed (see FIG. 4D). However, an embodiment of the disclosed invention is not limited to this.

In addition, after the conductive layer 228 is formed, heat treatment is performed at 100° C. to 500° C., typically 200° C. to 400° C. The atmosphere in which the heat treatment is performed can be, for example, an air atmosphere, a nitrogen atmosphere, an oxygen atmosphere, or the like. Further, the heat treatment time can be about 0.1 to 5 hours. Here, the heat treatment at 350° C. for one hour in an air atmosphere is performed. Note that the timing of the heat treatment is not particularly limited as long as it is after the insulating layer 226 is formed. For example, the above heat treatment may be performed just after the insulating layer 226 is formed or after another insulating layer, conductive layer, or the like is formed. By performing the heat treatment (the second heat treatment) and the preceding heat treatment (the first heat treatment), the characteristics of the semiconductor elements can be improved and variation in the characteristics can be reduced.

Note that the effect of the second heat treatment is not limited to the above. For example, the second heat treatment also provides an advantageous effect of repairing defects in the insulating layer 226. Since the insulating layer 226 is formed at a relatively low temperature, defects exist in the film. The element characteristics might be adversely affected when the insulating layer is used as it is. From a perspective of repairing such defects in the insulating layer 226, it can be said that the above-described heat treatment plays an important role.

Note that it is preferable that the heat treatment be performed at 400° C. or lower so as not to change (deteriorate) the characteristics of the insulating layer 208 which functions as the gate insulating layer. Needless to say, an embodiment of the disclosed invention should not be interpreted as being limited thereto.

As described in this embodiment, by performing plasma treatment on the oxide semiconductor film 220 with the use of a cation, the oxide semiconductor element having excellent characteristics can be provided. When the insulating layer 208 in contact with the oxide semiconductor film 220 and/or the insulating layer 226 are/is subjected to the treatment, the semiconductor element with higher reliability can be obtained. Accordingly, a semiconductor device including an oxide semiconductor element which has excellent characteristics can be provided.

Note that this embodiment can be implemented in combination with the previous embodiment as appropriate.

Embodiment 3

In this embodiment, an example of a method for manufacturing a semiconductor element used for a semiconductor device is described with reference to drawings.

Figure 5A:
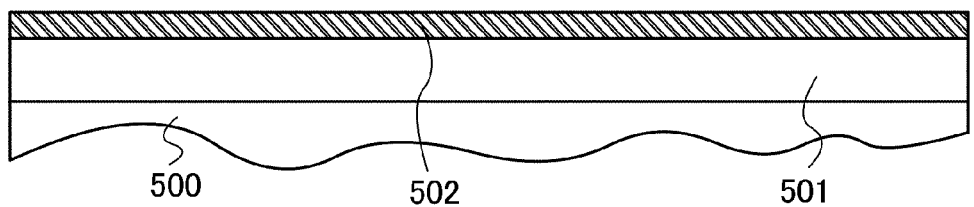
FIGS. 5A to 5D are cross-sectional views illustrating a method for manufacturing a semiconductor element used for a semiconductor device.

First, a conductive film 502 is formed over a substrate 500 (see FIG. 5A). Before the conductive film 502 is formed, treatment which is similar to the first plasma treatment described in Embodiment 1 may be performed on the substrate 500, which is an insulator. Since the plasma treatment may be performed on an insulating surface of the substrate which is in contact with an oxide semiconductor layer 508 formed later, it is not necessarily performed at this stage. In the case where a base layer 501 described later is formed as an insulating layer between the substrate 500 and the conductive film 502, the plasma treatment may performed on the base layer 501. Note that the plasma may be generated by a microwave. A frequency at this time is 2.45 GHz, for example.

Any substrate can be used for the substrate 500 as long as it is a substrate having an insulating surface, for example, a glass substrate. Further, it is preferable that the glass substrate be an alkali-free glass substrate. As a material of the alkali-free glass substrate, a glass material such as aluminosilicate glass, aluminoborosilicate glass, barium borosilicate glass, or the like is used, for example. Alternatively, as the substrate 500, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used. In addition, a plastic substrate can be used as long as it can withstand heat treatment in a manufacturing process.

The conductive film 502 is preferably formed using a conductive material such as aluminum (Al), copper (Cu), molybdenum (Mo), tungsten (W), or titanium (Ti). As a formation method, a sputtering method, a vacuum evaporation method, a plasma CVD method, and the like are given. In the case of using aluminum (or copper) for the conductive film 502, since aluminum itself (or copper itself) has disadvantages such as low heat resistance and a tendency to be corroded, it is preferably formed in combination with a conductive material having heat resistance.

As the conductive material having heat resistance, it is possible to use metal containing an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, a nitride containing any of these elements as its component, or the like. The conductive material having heat resistance and aluminum (or copper) may be stacked, whereby the conductive film 502 may be formed.

The base layer 501 may be formed over the substrate 500. The base layer 501 has a function of preventing diffusion of an impurity from the substrate 500, such as an alkali metal (e.g., Li, Cs, or Na) or an alkaline earth metal (e.g., Ca or Mg). In other words, the provision of the base layer 501 can realize improvement in the reliability of the semiconductor device. The base layer 501 may be formed with a single-layer structure or a layered structure using a variety of insulating materials such as silicon nitride or silicon oxide. Specifically, for example, a structure in which silicon nitride and silicon oxide are stacked in that order over the substrate 500 is favorable. This is because silicon nitride has a high blocking effect against an impurity. At the same time, in the case where silicon nitride is in contact with a semiconductor, there is a possibility that a problem occurs in the semiconductor element; thus, silicon oxide is preferably applied as a material to be in contact with the semiconductor. The base layer 501 can be formed by a sputtering method or a plasma CVD method.

Next, a resist mask is selectively formed over the conductive film 502 and the conductive film 502 is selectively etched using the resist mask to form conductive layers 506 functioning as source and drain electrodes.

The resist mask is formed through steps such as application of a resist material, light exposure using a photomask, and development. For the application of the resist material, a method such as a spin-coating method can be employed. Instead, the resist mask may be selectively formed by a droplet discharging method, a screen printing method, or the like. In that case, the steps of light exposure using a photomask, development, and the like are not needed; therefore, improvement in productivity can be achieved. Note that the resist mask is removed after the conductive layers 506 are formed by etching the conductive film 502.

The resist mask may be formed using a multi-tone mask. Here, the multi-tone mask is a mask which enables light exposure with multi-level light intensity. With the use of a multi-tone mask, one-time exposure and development process allow a resist mask with plural thicknesses (typically, two kinds of thicknesses) to be formed. By use of the multi-tone mask, the number of steps can be suppressed.

As the above etching treatment, dry etching may be used, or wet etching may be used. In order to improve coverage with a gate insulating layer or the like which is formed later and prevent disconnection, the etching is preferably performed so that end portions of the conductive layers 506 are tapered. For example, the end portions are preferably tapered at a taper angle greater than or equal to 20° and less than 90°. Here, the "taper angle" refers to an acute angle formed by a side surface of a layer which is tapered to a bottom surface thereof when the layer having a tapered shape is observed from a cross-sectional direction.

Figure 5B:
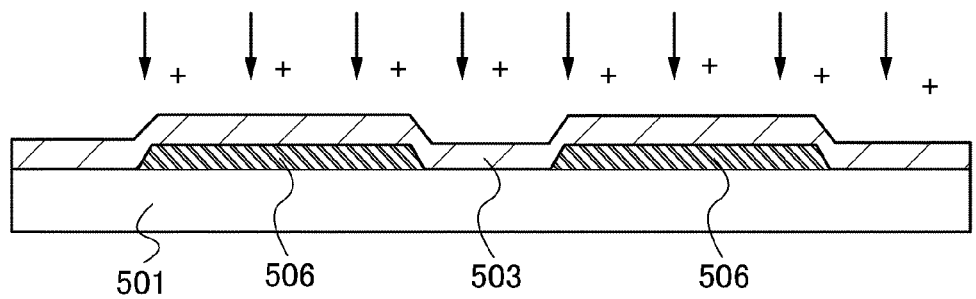

Next, an oxide semiconductor film 503 is formed to cover the conductive layers 506 (see FIG. 5B). The oxide semiconductor film 503 can be formed using the material and the method described in Embodiment 1. Note that heat treatment may be performed after the oxide semiconductor film 503 is formed and before or after the oxide semiconductor film 503 is processed into an island shape. In this embodiment, treatment which is similar to the first heat treatment described in Embodiment 1 is performed.

Subsequently, treatment which is similar to the second plasma treatment is performed on the oxide semiconductor film 503. This treatment is performed before or after the oxide semiconductor film 503 is processed into an island shape (see FIG. 5B or FIG. 5C). The oxide semiconductor film 503 is processed into an island shape by a photolithography method or the like to be the oxide semiconductor layer 508. The plasma may be generated by a microwave. A frequency at this time is 2.45 GHz, for example.

Then, an insulating layer 510 functioning as a gate insulating film is formed. After that, treatment which is similar to the first plasma treatment may be performed on the insulating layer 510. Next, a conductive layer 512 functioning as a gate electrode is formed. These layers can be formed using the materials and the methods which are described in the above embodiment. The plasma may be generated by a microwave. A frequency at this time is 2.45 GHz, for example.

Figure 5C:
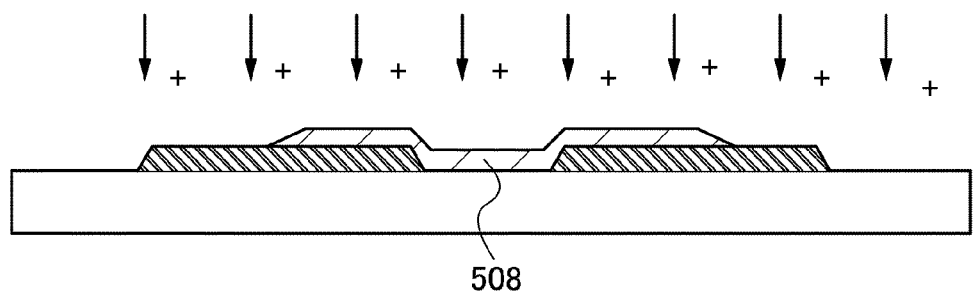

Next, an insulating layer 514 is formed to cover the conductive layer 512 and the insulating layer 510 (see FIG. 5C). Here, the insulating layer 514 corresponds to a so-called interlayer insulating layer. The insulating layer 514 can be formed using a material such as silicon oxide, aluminum oxide, or tantalum oxide. The insulating layer 514 may also be formed by stacking films formed of these materials.

Figure 5D:
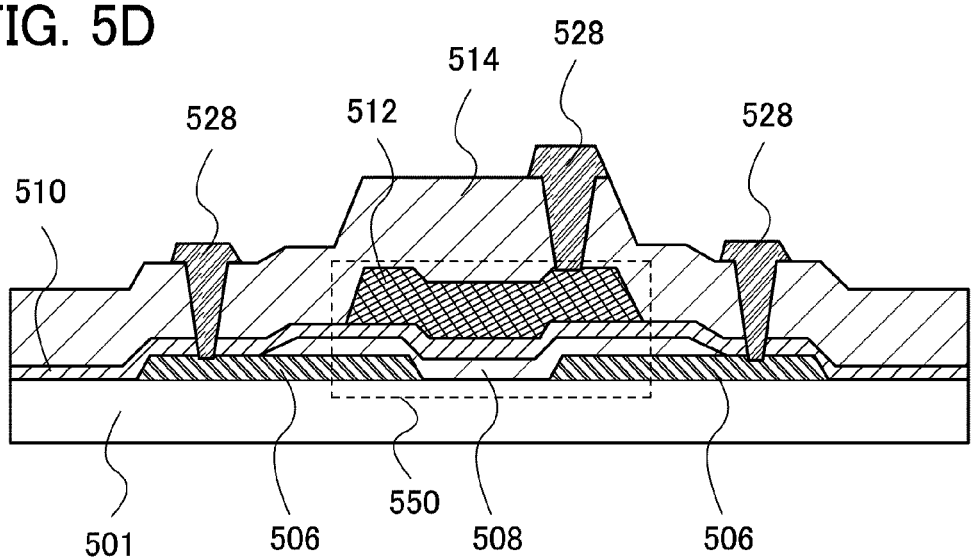

After that, a variety of electrodes and a wiring are formed, whereby a semiconductor device provided with a transistor 550 is completed (see FIG. 5D). In this embodiment, a typical example is described in which conductive layers 528 functioning as pixel electrodes of a display device are formed (see FIG. 5D). However, an embodiment of the disclosed invention is not limited thereto.

In addition, after the conductive layers 528 are formed, heat treatment is performed at 100° C. to 500° C., typically 200° C. to 400° C. The atmosphere in which the heat treatment is performed can be, for example, an air atmosphere, a nitrogen atmosphere, an oxygen atmosphere, or the like. Further, the heat treatment time can be about 0.1 to 5 hours. Here, the heat treatment at 250° C. for one hour in a nitrogen atmosphere is performed. Note that the timing of the heat treatment is not particularly limited as long as it is after the insulating layer 510 is formed. For example, the above heat treatment may be performed just after the insulating layer 510 is formed or after another insulating layer, conductive layer, or the like is formed. By performing the heat treatment (the second heat treatment) and the preceding heat treatment (the first heat treatment), the characteristics of the semiconductor elements can be improved and variation in the characteristics can be reduced.

It is preferable that the heat treatment be performed at 400° C. or lower so as not to change (deteriorate) the characteristics of the insulating layer 510 which functions as the gate insulating layer. Needless to say, an embodiment of the disclosed invention should not be interpreted as being limited thereto.

As described in this embodiment, by performing plasma treatment on the oxide semiconductor film 503 or the oxide semiconductor layer 508 with the use of a cation, the oxide semiconductor element having excellent characteristics can be provided. When the insulating layer 510 in contact with the oxide semiconductor layer 508 is also subjected to the treatment, the semiconductor element with higher reliability can be obtained. Similarly, the treatment may be performed on the substrate 500 or the base layer 501 which is in contact with the oxide semiconductor layer 508. Accordingly, a semiconductor device including an oxide semiconductor element which has excellent characteristics can be provided.

As illustrated in FIG. 6D, a stacking order of the conductive layers 506 and the oxide semiconductor layer 508 may be inversed. In that case, treatment which is similar to the second plasma treatment is preferably performed at a stage when the oxide semiconductor layer is exposed. For example, the treatment is preferably performed at the timing after the oxide semiconductor film 503 is formed and before the oxide semiconductor film 503 is processed into an island shape as illustrated in FIG. 6A; the timing after the oxide semiconductor film 503 is processed to be the island-shaped oxide semiconductor layer 508 as illustrated in FIG. 6B; the timing after the conductive layers 506 are formed as illustrated in FIG. 6C; or the like. The plasma may be generated by a microwave. A frequency at this time is 2.45 GHz, for example.

Note that this embodiment can be implemented in combination with the previous embodiment as appropriate.

Embodiment 4

Figure 9:
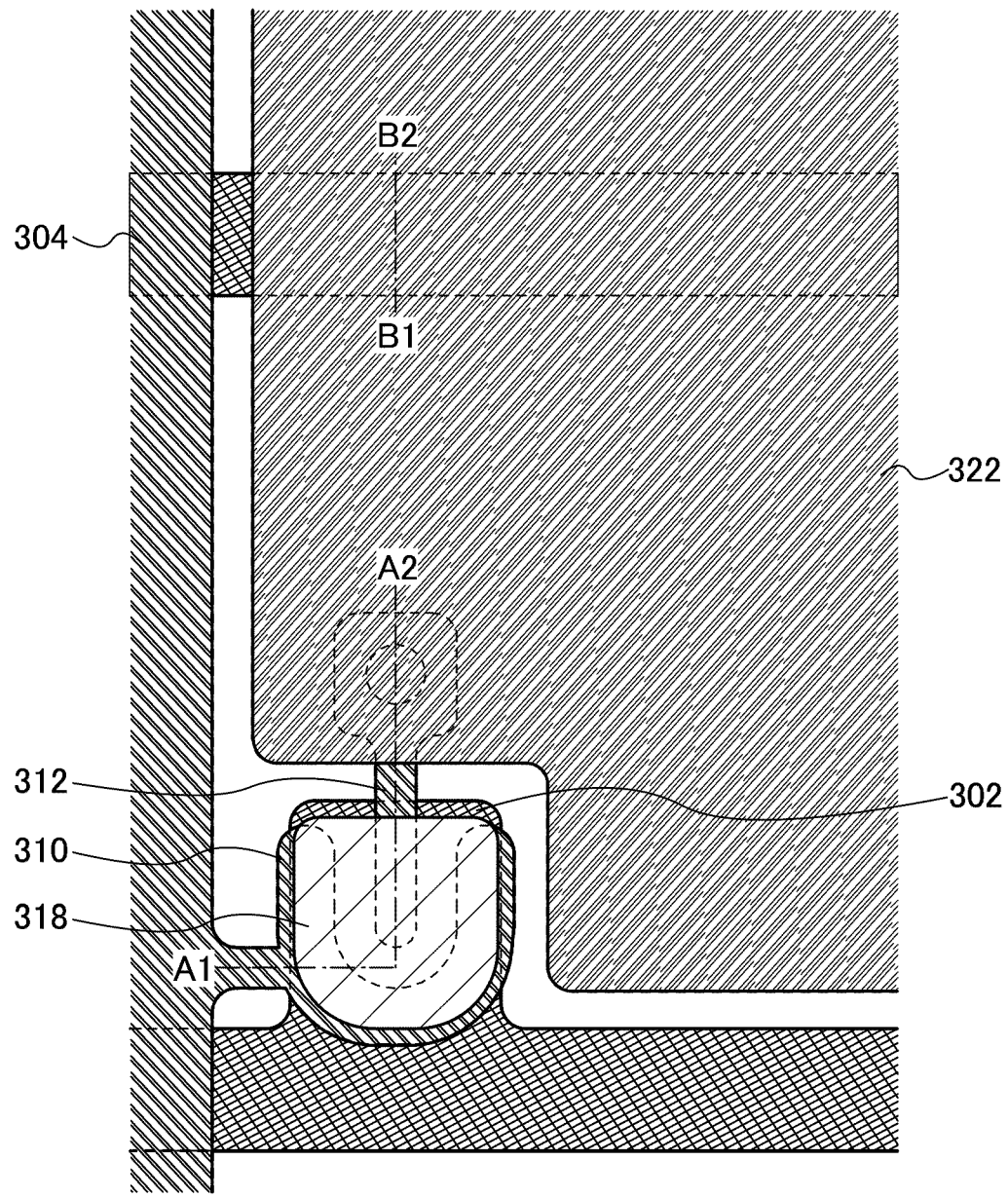
FIG. 9 is a plan view of the semiconductor device.

In this embodiment, a manufacturing process of an active matrix substrate which is an example of a semiconductor device is described with reference to drawings. Note that many parts of the manufacturing process described in this embodiment are the same as those in the above embodiments. Therefore, in the following description, repeated description of the same portions is omitted, and different points are described in detail. Note that in the following description, FIGS. 7A to 7C and FIGS. 8A to 8C are cross-sectional views and FIG. 9 is a plan view. In addition, line A1-A2 and line B1-B2 in each of FIGS. 7A to 7C and FIGS. 8A to 8C correspond to line A1-A2 and line B1-B2 in FIG. 9, respectively. Note also that in this embodiment, a semiconductor element illustrated in a structure taken along line A1-A2 is similar to the semiconductor element described in Embodiment 2.

First, a wiring and an electrode (a gate electrode 302, a capacitor wiring 304, and a first terminal 306) are formed over a substrate 300 (see FIG. 7A). Specifically, after a conductive layer is formed over the substrate, the wiring and electrode are formed through an etching using a resist mask. In this embodiment, the wiring and electrode can be formed by a method similar to the method which is shown in the above embodiments; therefore, the above embodiments (the description with reference to FIGS. 1A and 1B, FIGS. 3A and 3B, or the like) can be referred to for the details. Note that in the above description, the distinction between "an electrode" and "a wiring" is made only for convenience, and their functions are not limited by the denomination of "the electrode" or "the wiring". For example, a gate electrode may refer to a gate wiring.

Note that the capacitor wiring 304 and the first terminal 306 can be formed at the same time using the same material and the same manufacturing method as those of the gate electrode 302. Therefore, for example, the gate electrode 302 and the first terminal 306 can be electrically connected. The above embodiments can be referred to for the details of the material and the manufacturing method of the gate electrode 302.

Next, a gate insulating layer 308 is formed over the gate electrode 302 and the gate insulating layer 308 is selectively etched so as to expose the first terminal 306, whereby a contact hole is formed (see FIG. 7B). The above embodiments (the description with reference to FIG. 1C, FIG. 3C, or the like) can be referred to for the detail of the gate insulating layer 308. There is no particular limitation on the etching treatment, and either dry etching or wet etching may be used.

Next, after a conductive film covering the gate insulating layer 308 and the first terminal 306 is formed, the conductive film is selectively etched, so that a source electrode 310, a drain electrode 312, a connection electrode 314, and a second terminal 316 are formed (see FIG. 7C). Note that in the above description, the distinction between "an electrode" and "a wiring" is made only for convenience, and their functions are not limited by the denomination of "the electrode" or "the wiring". For instance, a source electrode may refer to a source wiring. In addition, the source electrode and the drain electrode may be interchanged depending on the structure or the operation condition of the transistor.

The above embodiments (the description with reference to FIGS. 2A and 2B, FIGS. 3D and 3E, or the like) can be referred to for the material, the manufacturing method, the etching treatment, or the like of the above conductive film. Note that by performing dry etching in the etching treatment, a wiring structure can be miniaturized as compared with the case of using wet etching. For example, the connection electrode 314 can be directly connected to the first terminal 306 through the contact hole formed in the gate insulating layer 308. In addition, the second terminal 316 can be electrically connected to the source electrode 310.

Next, after an oxide semiconductor film is formed to cover at least the source electrode 310 and the drain electrode 312, the oxide semiconductor film is selectively etched to form an oxide semiconductor layer 318 (see FIG. 8A). Here, the oxide semiconductor layer 318 is in contact with parts of the source electrode 310 and the drain electrode 312. The above embodiments (the description with reference to FIGS. 1D and 1E, FIGS. 4A and 4B, or the like) can be referred to for the detail of the oxide semiconductor layer 318.

Subsequently, treatment which is similar to the second plasma treatment described in Embodiment 1 is performed. The plasma treatment may be performed at a stage when at least part of the oxide semiconductor layer 318 is exposed; therefore, the treatment is not necessarily performed at this stage. Note that not only the treatment but also treatment which is similar to the first plasma treatment of the above embodiments may be performed at a stage when at least part of an insulating layer in contact with the oxide semiconductor layer 318 is exposed.

After the oxide semiconductor layer 318 is formed, heat treatment at 100° C. to 500° C., typically 200° C. to 400° C., is performed. The atmosphere of the heat treatment can be, for example, an air atmosphere, a nitrogen atmosphere, an oxygen atmosphere, or the like. Further, the heat treatment time can be about 0.1 to 5 hours. Here, the heat treatment at 350° C. for one hour in an air atmosphere is performed. Note that the timing of the heat treatment is not particularly limited as long as it is after the oxide semiconductor layer 318 is formed and before an insulating layer serving as an interlayer insulating layer is formed. For example, the heat treatment may be performed just after the oxide semiconductor layer 318 is formed. By performing the heat treatment (the first heat treatment) and the following heat treatment (the second heat treatment), the characteristics of the semiconductor elements can be improved and variation in the characteristics can be reduced.

Note that it is preferable that the heat treatment be performed at 400° C. or lower so as not to change (deteriorate) the characteristics of the gate insulating layer 308. Needless to say, an embodiment of the disclosed invention should not be interpreted as being limited thereto.

Then, an insulating layer 320 is formed to cover the source electrode 310, the drain electrode 312, the oxide semiconductor layer 318, and the like and the insulating layer 320 is selectively etched, whereby contact holes which reach the drain electrode 312, the connection electrode 314, and the second terminal 316 are formed (see FIG. 8B). The insulating layer 320 can be formed using a material such as silicon oxide, aluminum oxide, or tantalum oxide. The insulating layer 320 may also be formed by stacking films formed of these materials.

The hydrogen concentration in the insulating layer 320 is preferably $1 \times 10^{21}$ atoms/cm$^3$ or less (preferably $5 \times 10^{20}$ atoms/cm$^3$ or less). In addition, the nitrogen concentration in the insulating layer 320 is preferably $1 \times 10^{19}$ atoms/cm$^3$ or less. Note that the above concentrations show the average values in the insulating layer 320.

As a more specific example of the insulating layer 320, which satisfies the above-described condition, a silicon oxide film formed by a sputtering method can be given. This is because, in the case of using a sputtering method, it is easy to reduce hydrogen concentration in the film as compared with the case of using a plasma CVD method. Needless to say, any of other methods including a plasma CVD method may be employed as long as the above condition is satisfied. For example, the hydrogen concentration in the film can be reduced in such a manner that the insulating layer 320 is formed by a plasma CVD method and then plasma treatment similar to that performed on the insulating layer 108 described in Embodiment 1 is performed on the insulating layer 320. The other conditions of the insulating layer 320 are not particularly limited. For example, the thickness of the insulating layer 320 may vary within a feasible range.

Next, a transparent conductive layer 322 which is electrically connected to the drain electrode 312, a transparent conductive layer 324 which is electrically connected to the connection electrode 314, and a transparent conductive layer 326 which is electrically connected to the second terminal 316 are formed (see FIG. 8C and FIG. 9).

The transparent conductive layer 322 functions as a pixel electrode and the transparent conductive layer 324 and the transparent conductive layer 326 function as electrodes or wirings used for connection with a flexible printed circuit (an FPC). More specifically, the transparent conductive layer 324 formed over the connection electrode 314 can be used as a terminal electrode for connection which functions as an input terminal of a gate wiring, and the transparent conductive layer 326 formed over the second terminal 316 can be used as a terminal electrode for connection which functions as an input terminal of a source wiring.

In addition, a storage capacitor can be formed using the capacitor wiring 304, the gate insulating layer 308, and the transparent conductive layer 322.

The transparent conductive layer 322, the transparent conductive layer 324, and the transparent conductive layer 326 can be formed using a material such as indium oxide ($In_2O_3$), indium tin oxide ($In_2O_3$—$SnO_2$, also abbreviated as ITO), or an indium oxide zinc oxide alloy ($In_2O_3$—$ZnO$). For example, after the films containing the above material are formed by a sputtering method, a vacuum evaporation method, or the like, an unnecessary portion is removed by etching, whereby the transparent conductive layer 322, the transparent conductive layer 324, and the transparent conductive layer 326 may be formed.

In addition, after the transparent conductive layer 322, the transparent conductive layer 324, and the transparent conductive layer 326 are formed, heat treatment is performed at 100° C. to 500° C., typically 200° C. to 400° C. The atmosphere of the heat treatment can be, for example, an air atmosphere, a nitrogen atmosphere, an oxygen atmosphere, or the like. Further, the heat treatment time can be about 0.1 to 5 hours. Here, the heat treatment at 350° C. for one hour in an air atmosphere is performed. Note that the timing of the heat treatment is not particularly limited as long as it is after the insulating layer 320 is formed. For example, the above heat treatment may be performed just after the insulating layer 320 is formed or after the contact holes are formed in the insulating layer 320. Alternatively, the heat treatment may be performed after another insulating layer, conductive layer, or the like is formed. By performing the heat treatment (the second heat treatment) and the preceding heat treatment (the first heat treatment), the characteristics of the semiconductor elements can be improved and variation in the characteristics can be reduced.

Note that the effect of the second heat treatment is not limited to the above. For example, the second heat treatment also provides an advantageous effect of repairing defects in the insulating layer 320. Since the insulating layer 320 is formed at a relatively low temperature, defects exist in the film. Thus, the element characteristics might be adversely affected when the insulating layer is used as it is. From a perspective of repairing such defects in the insulating layer 320, it can be said that the above-described heat treatment plays an important role.

Note that it is preferable that the heat treatment be performed at 400° C. or lower so as not to change (deteriorate) the characteristics of the gate insulating layer 308. Needless to say, an embodiment of the disclosed invention should not be interpreted as being limited thereto.

Through the above steps, an active matrix substrate including a bottom-gate transistor 350 and an element such as a storage capacitor can be completed. For example, in the case of manufacturing an active matrix liquid crystal display device by using this, a liquid crystal layer may be provided between an active matrix substrate and a counter substrate provided with a counter electrode, and the active matrix substrate and the counter substrate may be fixed to each other.

As described in this embodiment, by performing plasma treatment on the oxide semiconductor layer 318 with the use of a cation, the oxide semiconductor element having excellent characteristics can be provided. When the insulating layer 308 in contact with the oxide semiconductor layer 318 and/or the insulating layer 320 are/is subjected to the treatment, the semiconductor element with higher reliability can be obtained. Accordingly, a semiconductor device including an oxide semiconductor element with excellent characteristics can be provided.

Note that although the case where the transistor 350 or other structures are formed using the method described in Embodiment 2 is described, the disclosed invention is not limited thereto. The method described in Embodiment 1 or the like may be used. Note that this embodiment can be implemented in combination with the above embodiment as appropriate.

Embodiment 5

In this embodiment, an example is described in which thin film transistors are manufactured and a semiconductor device having a display function (also referred to as a display device) is manufactured using the thin film transistors in a pixel portion and in a driver circuit. Further, part or whole of a driver circuit can be formed over the same substrate as a pixel portion, whereby a system-on-panel can be obtained.

The display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, may be used.

The display device includes in its category a panel in which a display element is sealed, and a module in which an IC including a controller or the like is mounted on the panel. Furthermore, an element substrate which forms a display device is provided with means for supplying current to the display element in each of pixels. Specifically, the element substrate may be in a state after only a pixel electrode of the display element is formed, or a state after a conductive film to be a pixel electrode is formed and before the conductive film is etched.

Note that a display device in this specification means an image display device, a display device, a light source (including a lighting device), and the like. Further, the display device also includes the following modules in its category: a module to which a connector such as an FPC (flexible printed circuit), a TAB (tape automated bonding) tape, or a TCP (tape carrier package) is attached; a module having a TAB tape or a TCP at the tip of which a printed wiring board is provided; a module in which an IC (integrated circuit) is directly mounted on a display element by a COG (chip on glass) method, and the like.

Hereinafter, in this embodiment, an example of a liquid crystal display device is described. FIGS. 10A1 and 10A2 are plan views and FIG. 10B is a cross-sectional view of panels in which thin film transistors 4010 and 4011 and a liquid crystal element 4013 that are formed over a first substrate 4001 are sealed by a second substrate 4006 and a sealant 4005. Here, each of FIGS. 10A1 and 10A2 is a plan view, and FIG. 10B is a cross-sectional view taken along M-N of FIGS. 10A1 and 10A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. In other words, the pixel portion 4002 and the scan line driver circuit 4004 are sealed together with a liquid crystal layer 4008, by the first substrate 4001, the sealant 4005, and the second substrate 4006. Further, a signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used as appropriate. FIG. 10A1 illustrates an example of mounting the signal line driver circuit 4003 by a COG method, and FIG. 10A2 illustrates an example of mounting the signal line driver circuit 4003 by a TAB method.

In addition, the pixel portion 4002 and the scan line driver circuit 4004 provided over the first substrate 4001 each include a plurality of thin film transistors. FIG. 10B illustrates the thin film transistor 4010 included in the pixel portion 4002 and the thin film transistor 4011 included in the scan line driver circuit 4004. Insulating layers 4020 and 4021 are provided over the thin film transistors 4010 and 4011.

The transistors described in any of the above embodiments or the like can be applied to the thin film transistors 4010 and 4011. Note that in this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed for the second substrate 4006. The liquid crystal element 4013 is formed by the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 provided therebetween.

Note that as the first substrate 4001 and the second substrate 4006, glass, metal (typically, stainless steel), ceramic, plastic, or the like can be used. As plastic, an FRP (fiberglass-reinforced plastics) substrate, a PVF (polyvinyl fluoride) film, a polyester film, an acrylic resin film, or the like can be used. Alternatively, a sheet with a structure in which an aluminum foil is sandwiched between PVF films or polyester films can be used.

A columnar spacer 4035 is provided in order to control the distance (a cell gap) between the pixel electrode layer 4030 and the counter electrode layer 4031. The columnar spacer 4035 can be obtained by selective etching of an insulating film. Note that a spherical spacer may be used instead of a columnar spacer. In addition, the counter electrode layer 4031 is electrically connected to a common potential line formed over the same substrate as the thin film transistor 4010. For example, the counter electrode layer 4031 can be electrically connected to the common potential line through conductive particles provided between the pair of substrates. Note that the conductive particles are preferably contained in the sealant 4005.

In the case of using a horizontal electric field mode, a liquid crystal exhibiting a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is preferably used. Thus, the temperature range in which the blue phase is generated can be extended. The liquid crystal composition which includes liquid crystal exhibiting a blue phase and a chiral agent has such characteristics that the response time is as short as 10 μs to 100 μs, alignment treatment is not needed because the liquid crystal composition has optical isotropy, and viewing angle dependency is small.

Although an example of a transmissive liquid crystal display device is described in this embodiment, the present invention is not limited thereto. An embodiment of the present invention may also be applied to a reflective liquid crystal display device or a semi-transmissive liquid crystal display device.

In this embodiment, an example of the liquid crystal display device is described (see FIG. 11) in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. In addition, the layered structure of the polarizing plate and the coloring layer is not limited to this embodiment. The layered structure can be varied as appropriate in accordance with the material, manufacturing conditions, or the like of the polarizing plate and the coloring layer. Further, a light-blocking film serving as a black matrix may be provided.

In this embodiment, in order to reduce the surface roughness of the thin film transistor, the thin film transistors obtained in the above embodiment are covered with the insulating layer 4021. As the insulating layer 4021, an organic material having heat resistance such as polyimide, acrylic resin, benzocyclobutene resin, polyamide, or epoxy resin can be used. Other than such organic materials, it is also possible to use a low-dielectric constant material (a low-k material), a siloxane-based resin, PSG (phosphosilicate glass), BPSG (borophosphosilicate glass), or the like.

Note that the insulating layer 4021 may be formed by stacking a plurality of insulating films formed of these materials.

Here, the siloxane-based resin corresponds to a resin including a Si—O—Si bond which is formed using a siloxane-based material as a starting material. As a substituent, an organic group (e.g., an alkyl group or an aryl group) or a fluoro group may be used. In addition, the organic group may include a fluoro group.

There is no particular limitation on the method of forming the insulating layer 4021, and the following method or means can be employed depending on the material, by a deposition method such as a sputtering method, an SOG method, a spin coating method, a dipping method, a spray coating method, or a droplet discharge method (e.g., an ink jet method, screen printing, or offset printing), or a tool such as a doctor knife, a roll coater, a curtain coater, a knife coater, or the like.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

A conductive composition containing a conductive high molecule (also referred to as a conductive polymer) may be used for the pixel electrode layer 4030 and the counter electrode layer 4031. The pixel electrode formed of the conductive composition has preferably a sheet resistance of less than or equal to $1.0 \times 10^4$ Ω/square and a transmittance of greater than or equal to 70% at a wavelength of 550 nm. Furthermore, the resistivity of the conductive high molecule contained in the conductive composition is preferably 0.1 Ω·cm or less.

As the conductive high molecule, a so-called π-electron conjugated conductive macromolecule can be used. For example, polyaniline or a derivative thereof, polypyrrole or a derivative thereof, polythiophene or a derivative thereof, a copolymer of two or more of aniline, pyrrole, and thiophene or a derivative thereof, or the like can be given.

A variety of signals are supplied to the signal line driver circuit 4003, the scan line driver circuit 4004, the pixel portion 4002, or the like from an FPC 4018.

In addition, a connection terminal electrode 4015 is formed from the same conductive film as the pixel electrode layer 4030 included in the liquid crystal element 4013, and a terminal electrode 4016 is formed from the same conductive film as source and drain electrode layers of the thin film transistors 4010 and 4011.

The connection terminal electrode 4015 is electrically connected to a terminal included in the FPC 4018 via an anisotropic conductive film 4019.

Although FIGS. 10A1, 10A2, and 10B, the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

Figure 11:
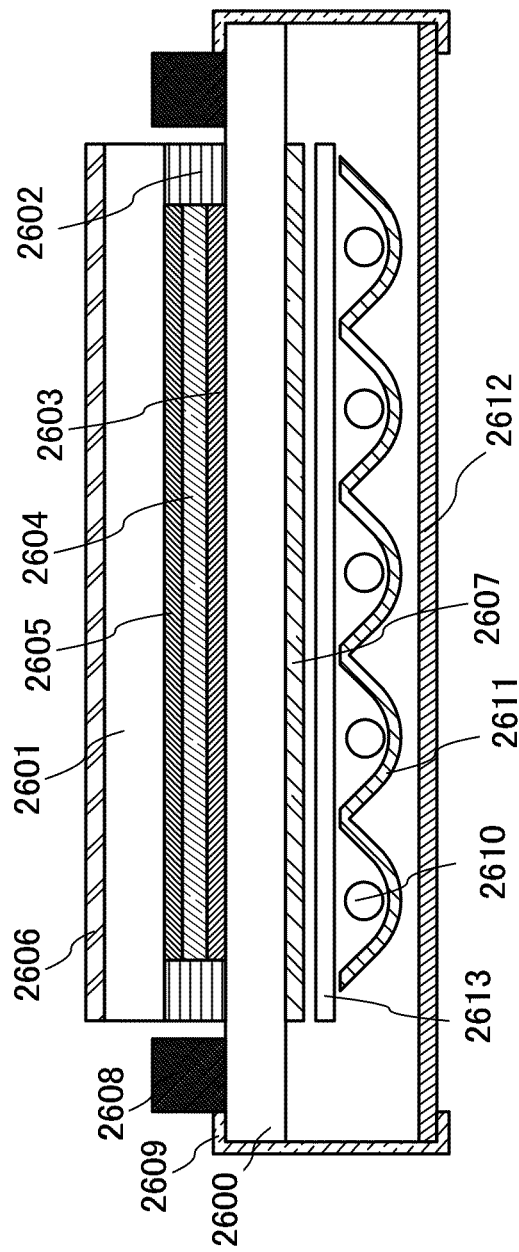
FIG. 11 illustrates a semiconductor device.

FIG. 11 illustrates an example in which a substrate 2600 provided with an oxide semiconductor element is used for a liquid crystal display module which corresponds to one mode of the semiconductor device.

In FIG. 11, the substrate 2600 provided with the oxide semiconductor element and a counter substrate 2601 are attached to each other with a sealant 2602, and between them, an element layer 2603 including an oxide semiconductor element and the like, a liquid crystal layer 2604 including an alignment film and/or a liquid crystal layer, a coloring layer 2605, and the like are provided to form a display region. The coloring layer 2605 is necessary for color display. In the case of an RGB method, respective coloring layers corresponding to red, green, and blue are provided for pixels. Polarizing plates 2606 and 2607 and a diffusion plate 2613 are provided outside the counter substrate 2601 and the substrate 2600 provided with the oxide semiconductor element. A light source includes a cold cathode tube 2610 and a reflective plate 2611. A circuit board 2612 is connected to a wiring circuit portion 2608 of the substrate 2600 provided with the oxide semiconductor element through a flexible wiring board 2609. Accordingly, an external circuit such as a control circuit or a power source circuit is included in a liquid crystal module. A retardation plate may be provided between the polarizing plate and the liquid crystal layer.

For a driving method of a liquid crystal, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

Through the above steps, a high-performance liquid crystal display device can be manufactured. This embodiment can be implemented in combination with the above embodiment, as appropriate.

Embodiment 6

In this embodiment, active matrix electronic paper that is an example of a semiconductor device will be described with reference to FIG. 12. A thin film transistor 650 used for the semiconductor device can be manufactured in a manner similar to that of the thin film transistor or the like described in the above embodiments.

Figure 12:
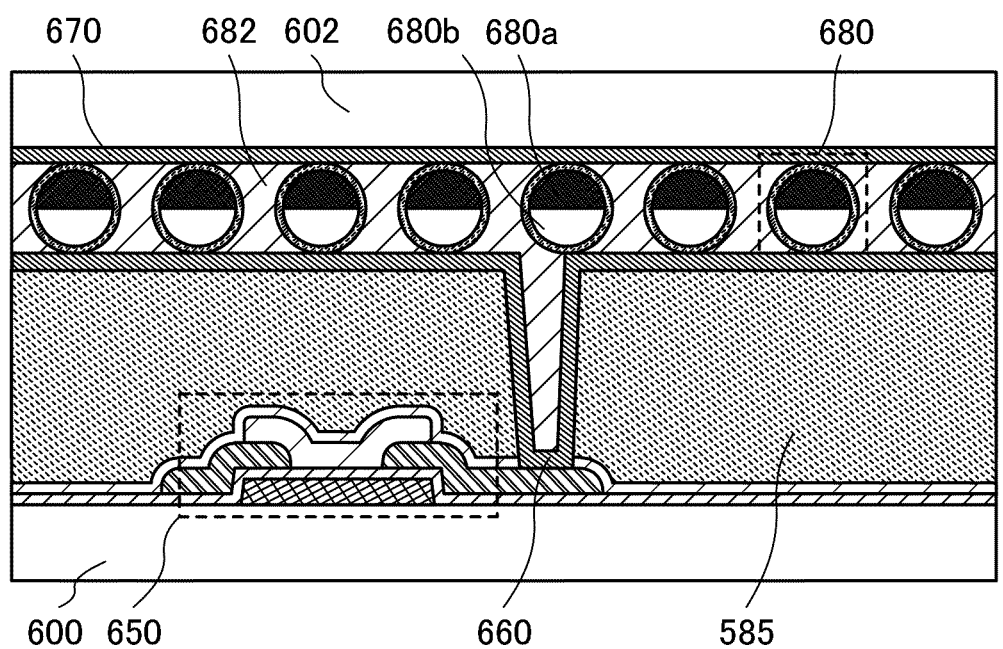
FIG. 12 illustrates a semiconductor device.

The electronic paper illustrated in FIG. 12 is an example of a display device in which a twist ball display method is employed. The twisting ball display system refers to a method in which spherical particles each colored in black and white are arranged between a first electrode layer and a second electrode layer, and a potential difference is generated between the first electrode layer and the second electrode layer, whereby orientation of the spherical particles is controlled, so that display is performed.

The source or drain electrode layer of the thin film transistor 650 is electrically connected to a first electrode layer 660 through a contact hole formed in an insulating layer 585. A substrate 602 is provided with a second electrode layer 670. Spherical particles 680 each having a black region 680*a* and a white region 680*b* are provided between the first electrode layer 660 and the second electrode layer 670. A space around the spherical particles 680 is filled with a filler 682 such as a resin (see FIG. 12). In FIG. 12, the first electrode layer 660 corresponds to a pixel electrode, and the second electrode layer 670 corresponds to a common electrode. The second electrode layer 670 is electrically connected to a common potential line provided over the same substrate as the thin film transistor 650.

Instead of the twisting ball, an electrophoretic display element can also be used. In that case, for example, a microcapsule having a diameter of approximately 10 μm to 200 μm in which transparent liquid, positively-charged white microparticles, and negatively-charged black microparticles are encapsulated, is preferably used. When an electric field is applied between the first electrode layer and the second electrode layer, the white microparticles and the black microparticles move to opposite sides from each other, so that white or black is displayed. The electrophoretic display element has higher reflectance than a liquid crystal display element, and thus, an auxiliary light is unnecessary and a display portion can be recognized in a place where brightness is not sufficient. In addition, there is an advantage that even when power is not supplied to the display portion, an image which has been displayed once can be maintained.

Thus, high-performance electronic paper can be manufactured using an embodiment of the disclosed invention. Note that this embodiment can be implemented in combination with the above embodiment as appropriate.

Embodiment 7

In this embodiment, a light-emitting display device which is an example of a semiconductor device will be described. Here, a case is described where a light-emitting element utilizing electroluminescence is used as a display element. Note that light-emitting elements utilizing electroluminescence are classified by whether a light-emitting material is an organic compound or an inorganic compound. In general, the former is called an organic EL element, and the latter is called an inorganic EL element.

In an organic EL element, when voltage is applied to a light-emitting element, electrons and holes are injected from a pair of electrodes into a layer containing a light-emitting organic compound. Then, the carriers (electrons and holes) recombine, thereby emitting light. Owing to such a mechanism, the light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination-type light emission which utilizes a donor level and an acceptor level. A thin-film-type inorganic EL element has a structure where a light-emitting layer is sandwiched between dielectric layers, which are further sandwiched between electrodes, and its light emission mechanism is localized-type light emission that utilizes inner-shell electron transition of metal ions. Note that an example of an organic EL element as a light-emitting element is described here.

Structures of the light-emitting element will be described with reference to FIGS. 13A to 13C. Here, the case where a driving transistor is an n-channel transistor is illustrated, and cross-sectional structures of pixels are described. Transistors 701, 711, and 721 used for semiconductor devices illustrated in FIGS. 13A to 13C can be manufactured in a manner similar to that of the transistors described in the above embodiment.

In order to extract light from a light-emitting element, at least one of the anode and the cathode is transparent. Here, transparent means that at least light with an emission wavelength has sufficiently high transmittance. As a method for extracting light, a thin film transistor and a light emitting element are formed over a substrate; and there are a top emission method (a top extraction method) by which light is extracted from a side opposite to the substrate, a bottom emission method (a bottom extraction method) by which light is extracted from the substrate side, a dual emission method (a dual extraction method) by which light is extracted from both the substrate side and the side opposite to the substrate, and the like.

Figure 13A:
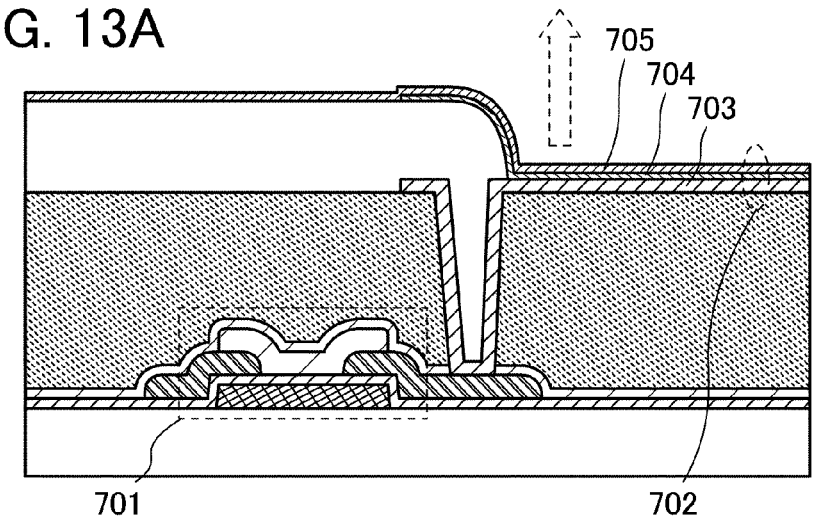
FIGS. 13A to 13C illustrate semiconductor devices.

A top-emission-type light-emitting element is described using FIG. 13A.

FIG. 13A is a cross-sectional view of a pixel in the case where light is emitted from a light-emitting element 702 to an anode 705 side. Here, a cathode 703 of the light-emitting element 702 is electrically connected to the transistor 701 which is a driving transistor, and a light-emitting layer 704 and the anode 705 are stacked in this order over the cathode 703. For the cathode 703, a conductive film which has a low work function and reflects light can be used. For example, a material such as Ca, Al, MgAg, or AlLi is preferably used to form the cathode 703. The light-emitting layer 704 may be formed using either a single layer or a plurality of layers stacked. When the light-emitting layer 704 is formed using a plurality of layers, an electron-injection layer, an electron-transport layer, a light-emitting layer, a hole-transport layer, and a hole-injection layer are preferably stacked in this order over the cathode 703; however, needless to say, it is not necessary to form all of these layers and a different layered structure may be employed. The anode 705 is formed using a light-transmitting conductive material. For example, a light-transmitting conductive material, such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added, may be used.

A structure in which the light-emitting layer 704 is sandwiched between the cathode 703 and the anode 705 can be called the light-emitting element 702. In the case of the pixel illustrated in FIG. 13A, light is emitted from the light-emitting element 702 to the anode 705 side as indicated by an arrow.

Figure 13B:
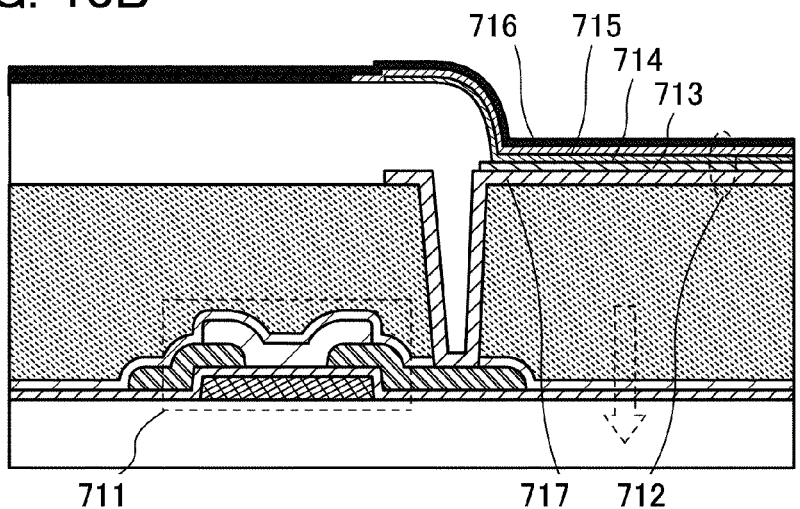

Next, a bottom-emission-type light-emitting element is described using FIG. 13B.

FIG. 13B is a cross-sectional view of a pixel in the case where light is emitted from a light-emitting element 712 to a cathode 713 side. Here, the cathode 713 of the light-emitting element 712 is formed over a light-transmitting conductive film 717 which is electrically connected to the driving transistor 711, and a light-emitting layer 714 and an anode 715 are stacked in this order over the cathode 713. Note that a light-blocking film 716 may be formed to cover the anode 715 when the anode 715 has a light-transmitting property. Similar to the case of FIG. 13A, the cathode 713 can be formed using a conductive material which has a low work function. The cathode 713 is formed to have a thickness that can transmit light (preferably, approximately 5 nm to 30 nm). For example, an aluminum film with a thickness of approximately 20 nm can be used as the cathode 713. The light-emitting layer 714 may be formed using a single layer or a plurality of layers stacked similarly to FIG. 13A. The anode 715 does not necessarily transmit light, but may be formed using a light-transmitting conductive material as in the case of FIG. 13A. As the light-blocking film 716, a metal which reflects light or the like can be used; however, it is not limited thereto. For example, a resin to which black pigments are added or the like can be used.

A structure in which the light-emitting layer 714 is sandwiched between the cathode 713 and the anode 715 can be called the light-emitting element 712. In the case of the pixel shown in FIG. 13B, light emitted from the light-emitting element 712 is extracted through the cathode 713 side as indicated by an arrow.

Next, a dual-emission-type light-emitting element is described with reference to FIG. 13C.

Figure 13C:
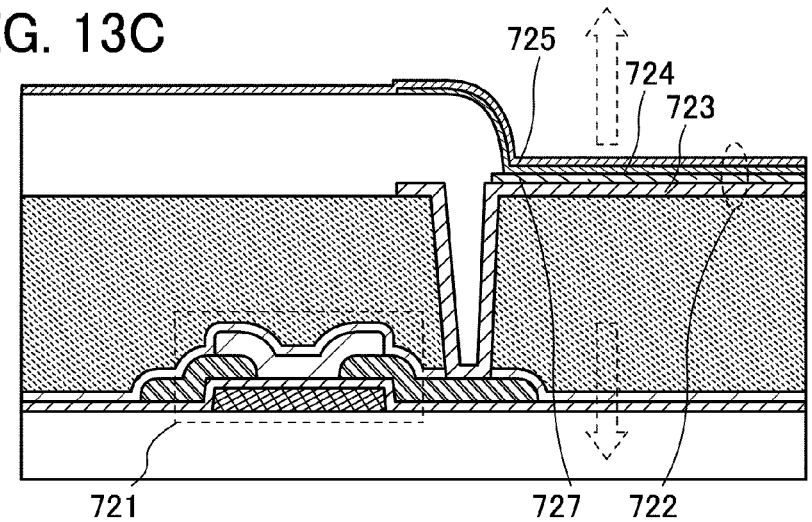

In FIG. 13C, a cathode 723 of a light-emitting element 722 is formed over a light-transmitting conductive film 727 which is electrically connected to the driving transistor 721, and a light-emitting layer 724 and an anode 725 are stacked in this order over the cathode 723. The cathode 723 can be formed using a conductive material which has a low work function as in the case of FIG. 13A. The cathode 723 is formed to have a thickness that can transmit light. For example, an Al film with a thickness of approximately 20 nm can be used as the cathode 723. As in FIG. 13A, the light-emitting layer 724 may be formed using a single layer or a plurality of layers stacked. As in FIG. 13A, the anode 725 can be formed using a light-transmitting conductive material.

A structure in which the cathode 723, the light-emitting layer 724, and the anode 725 overlap with each other can be called the light-emitting element 722. In the case of the pixel illustrated in FIG. 13C, light is emitted from the light-emitting element 722 to both the anode 725 side and the cathode 723 side as indicated by arrows.

Although a case of using an organic EL element as a light-emitting element is described here, an inorganic EL element can also be used as a light-emitting element. The example is described here in which a thin film transistor (a driving transistor) which controls the driving of a light-emitting element is electrically connected to the light-emitting element; however, a transistor for current control or the like may be connected between the driving transistor and the light-emitting element.

The structure of the semiconductor device described in this embodiment is not limited to the structures of FIGS. 13A to 13C and can be modified in various ways.

Next, the appearance and a cross section of a light-emitting display panel (also referred to as a light-emitting panel) are described with reference to FIGS. 14A and 14B. FIG. 14A is a plan view and FIG. 14B is a cross-sectional view of a panel in which thin film transistors 4509 and 4510 and a light-emitting element 4511 that are formed over a first substrate 4501 are sealed by a second substrate 4506 and a sealant 4505. Here, FIG. 14A is a plan view and FIG. 14B is a cross-sectional view taken along line H-I in FIG. 14A.

The sealant 4505 is provided to surround a pixel portion 4502, signal line driver circuits 4503a and 4503b, and scan line driver circuits 4504a and 4504b, which are provided over the first substrate 4501. In addition, the second substrate 4506 is provided over the pixel portion 4502, the signal line driver circuits 4503a and 4503b, and the scan line driver circuits 4504a and 4504b. That is, the pixel portion 4502, the signal line driver circuits 4503a and 4503b, and the scan line driver circuits 4504a and 4504b are sealed together with a filler 4507, with the first substrate 4501, the sealant 4505, and the second substrate 4506. In such a manner, it is preferable that packaging (sealing) be performed using a protective film (such as a bonding film or an ultraviolet curable resin film), a cover material, or the like with high air-tightness and little degasification.

The pixel portion 4502, the signal line driver circuits 4503a and 4503b, and the scan line driver circuits 4504a and 4504b, which are formed over the first substrate 4501, each include a plurality of thin film transistors. FIG. 14B illustrates the thin film transistor 4510 included in the pixel portion 4502 and the thin film transistor 4509 included in the signal line driver circuit 4503a.

As the thin film transistors 4509 and 4510, the transistors described in the above embodiments can be employed. Note that in this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a layered structure of the first electrode layer 4517, an electroluminescent layer 4512, and a second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, organic polysiloxane, or the like. It is particularly preferable that the partition 4520 be formed using a photosensitive material to have an opening portion over the first electrode layer 4517 so that a sidewall of the opening portion is formed as an inclined surface with continuous curvature.

The electroluminescent layer 4512 may be formed using either a single layer or a plurality of layers stacked.

A protective film may be formed over the second electrode layer 4513 and the partition 4520 in order to prevent oxygen, hydrogen, moisture, carbon dioxide, or the like from entering the light-emitting element 4511. As the protective film, a silicon nitride film, a silicon nitride oxide film, a DLC (diamond like carbon) film, or the like can be formed.

A variety of signals are supplied to the signal line driver circuits 4503a and 4503b, the scan line driver circuits 4504a and 4504b, the pixel portion 4502, or the like from FPCs 4518a and 4518b.

In this embodiment, an example is described in which a connection terminal electrode 4515 is formed from the same conductive film as the first electrode layer 4517 of the light-emitting element 4511, and a terminal electrode 4516 is formed from the same conductive film as the source and drain electrode layers of the thin film transistors 4509 and 4510.

The connection terminal electrode 4515 is electrically connected to a terminal included in the FPC 4518a via an anisotropic conductive film 4519.

The substrate located in the direction in which light is extracted from the light-emitting element 4511 needs to have a light-transmitting property. As a substrate having a light-transmitting property, a glass plate, a plastic plate, a polyester film, an acrylic film, and the like are given.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. In this embodiment, an example in which nitrogen is used for the filler is described.

If needed, an optical film, such as a polarizing plate, a circularly polarizing plate (including an elliptically polarizing plate), a retardation plate (a quarter-wave plate or a half-wave plate), or a color filter, may be provided on a light-emitting surface of the light-emitting element. Furthermore, an antireflection treatment may be performed on a surface thereof. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be formed using a single crystal semiconductor film or a polycrystalline semiconductor film over a substrate separately prepared. Alternatively, only the signal line driver circuits or part thereof or only the scan line driver circuits or part thereof may be separately formed and mounted. This embodiment is not limited to the structure illustrated in FIGS. 14A and 14B.

Through the above process, a high-performance light-emitting display device (display panel) can be manufactured. Note that this embodiment can be implemented in combination with the above embodiment as appropriate.

Embodiment 8

The semiconductor device manufactured by the method for manufacturing a semiconductor device according to an embodiment of the present invention can be applied to electronic paper. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. Examples of the electronic devices are illustrated in FIGS. 15A and 15B and FIG. 16.

Figure 15A:
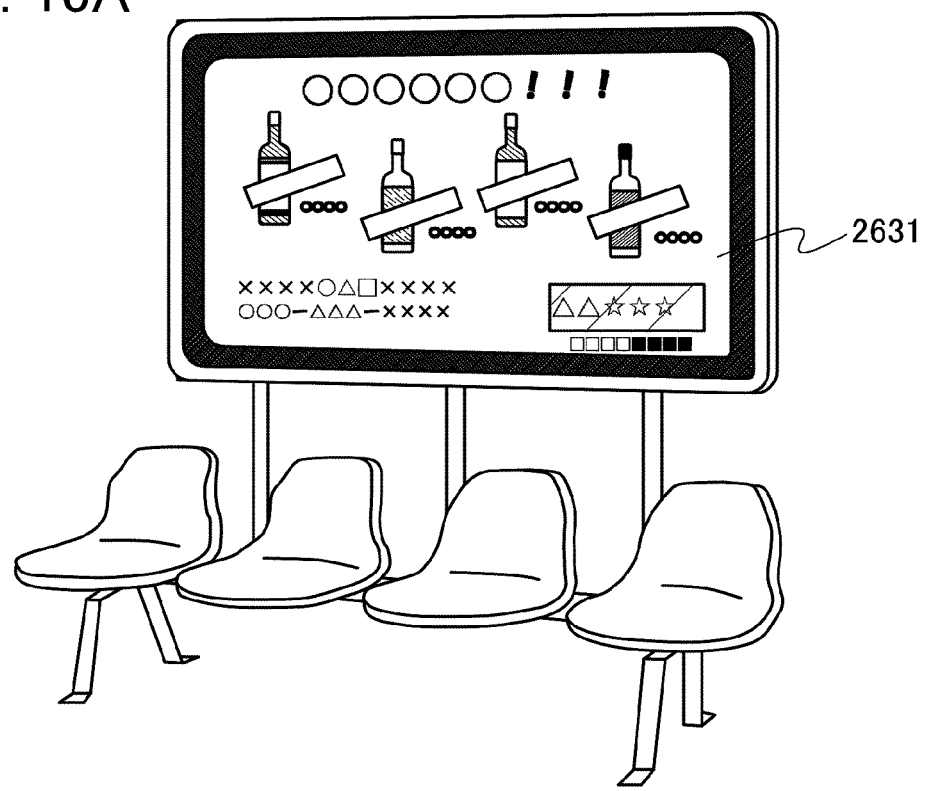
FIGS. 15A and 15B illustrate examples of a usage pattern of electronic paper.

FIG. 15A illustrates a poster 2631 formed using electronic paper. In the case where an advertising medium is printed paper, the advertisement is replaced by hands; however, by using the electronic paper, the advertising display can be changed in a short time. Furthermore, stable images can be obtained without display defects. Note that the poster may have a configuration capable of wirelessly transmitting and receiving data.

Figure 15B:
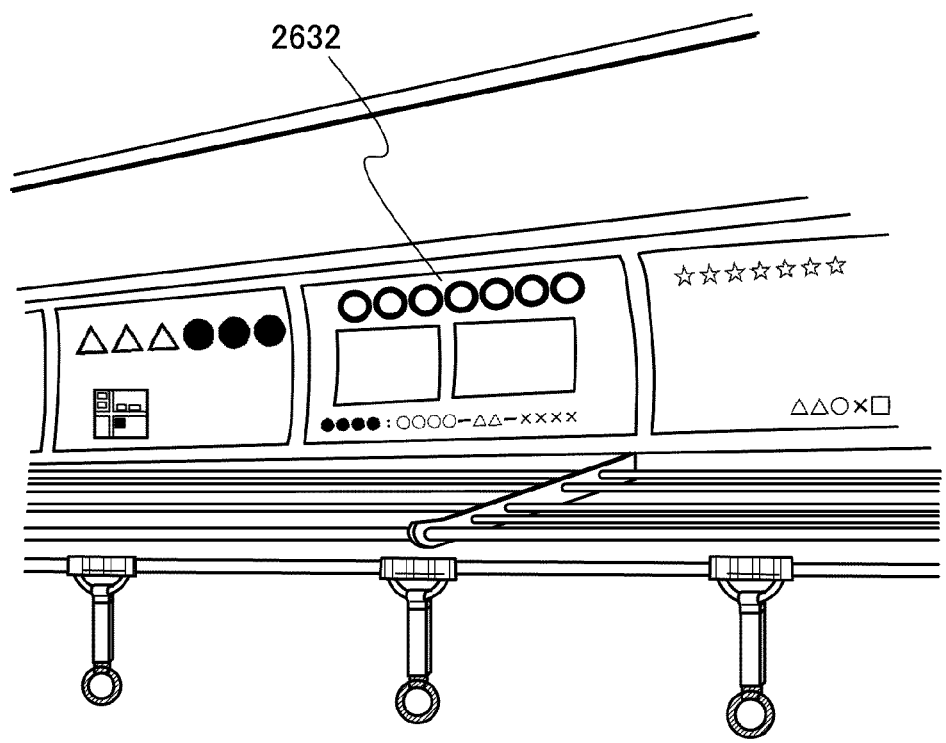

FIG. 15B illustrates an advertisement 2632 in a vehicle such as a train. In the case where an advertising medium is printed paper, the advertisement is replaced by hands; however, by using an electronic paper, advertising display can be changed in a short time without using much human resources. Furthermore, stable images can be obtained without display defects. Note that the advertisement in a vehicle may have a configuration capable of wirelessly transmitting and receiving data.

Figure 16:
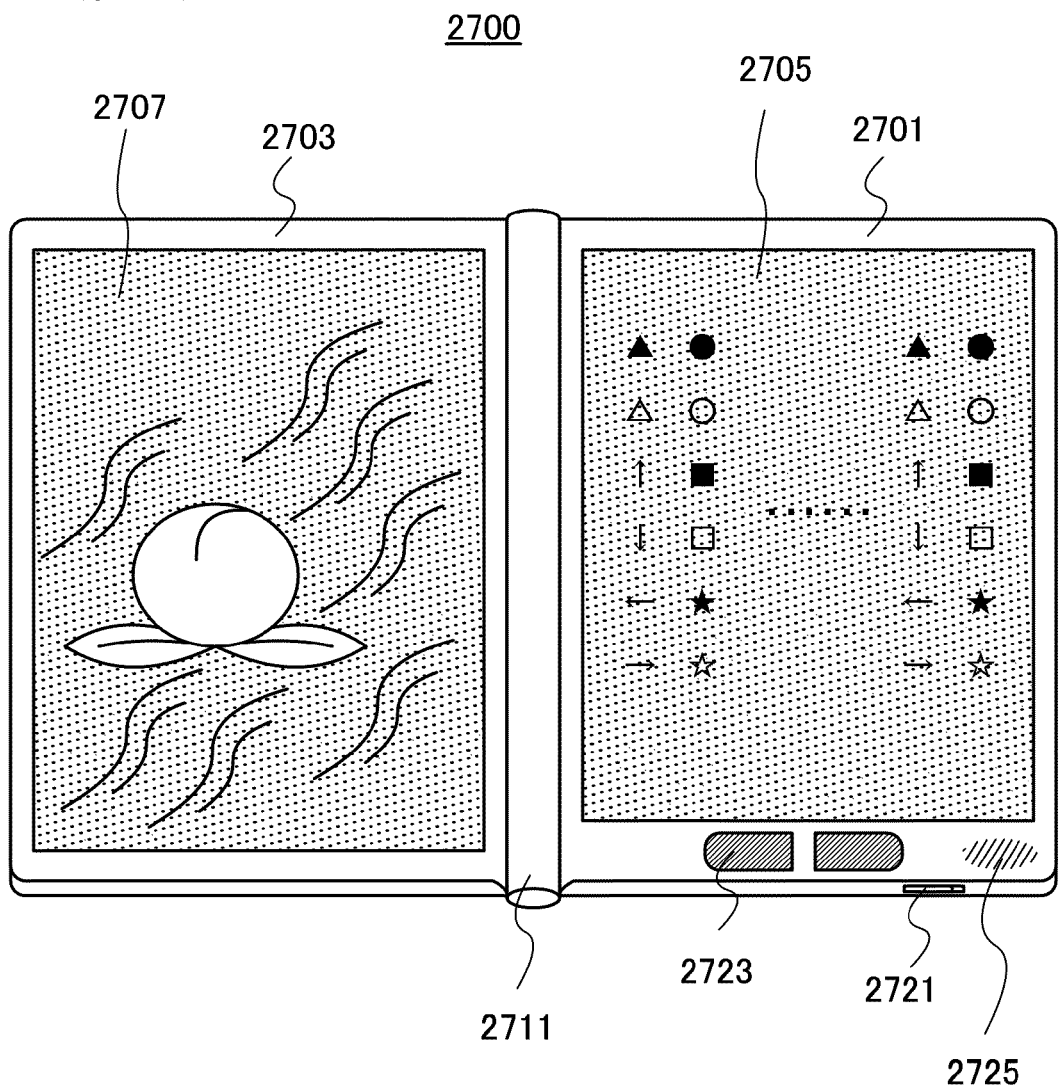
FIG. 16 is an external view illustrating an example of an e-book reader.

FIG. 16 illustrates an example of an e-book reader. For example, an e-book reader 2700 includes a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on the display portion 2705 and the display portion 2707, for example, the right display portion (the display portion 2705 in FIG. 16) can display text and the left display portion (the display portion 2707 in FIG. 16) can display images.

FIG. 16 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented in combination with the above embodiment, as appropriate.

Embodiment 9

A semiconductor device which is manufactured by a method for manufacturing a semiconductor device according to an embodiment of the present invention can be applied to a variety of electronic appliances (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 17A:
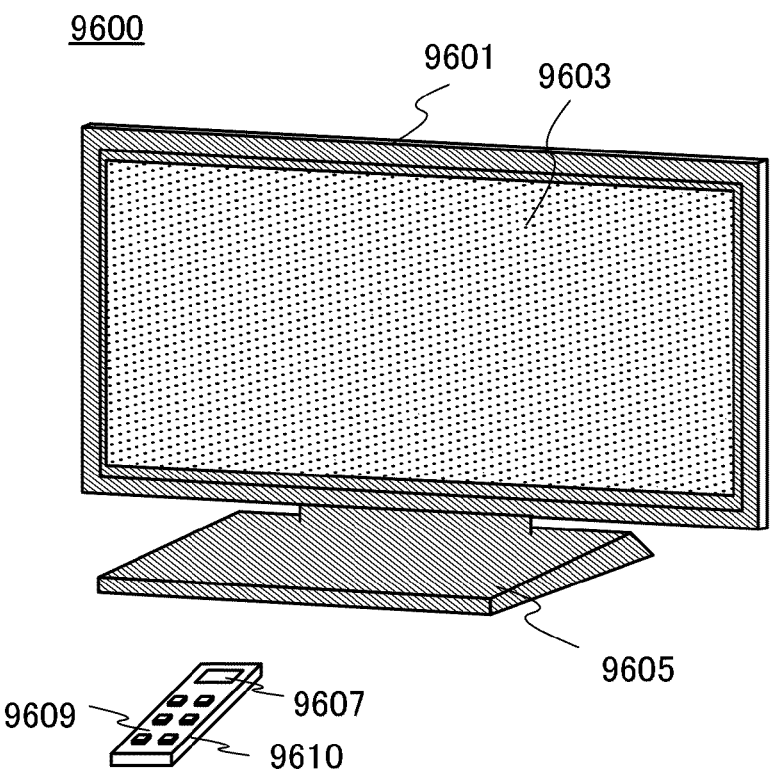
FIGS. 17A and 17B are external views illustrating examples of a television set and a digital photo frame.

FIG. 17A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying information output from the remote controller 9610.

Note that the television set 9600 is provided with a receiver, a modem, and the like. With the use of the receiver, general television broadcasting can be received. Moreover, when the television set 9600 is connected to a communication network with or without wires via the modem, one-way (from a sender to a receiver) or two-way (between a sender and a receiver or between receivers) information communication can be performed.

Figure 17B:
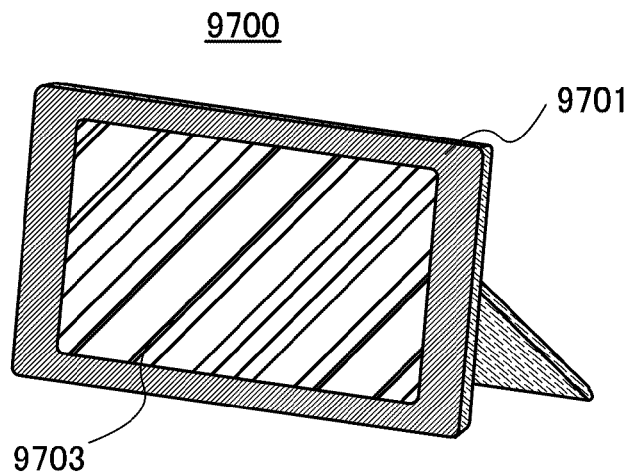

FIG. 17B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive information wirelessly. The structure may be employed in which desired image data is transferred wirelessly to be displayed.

Figure 18A:
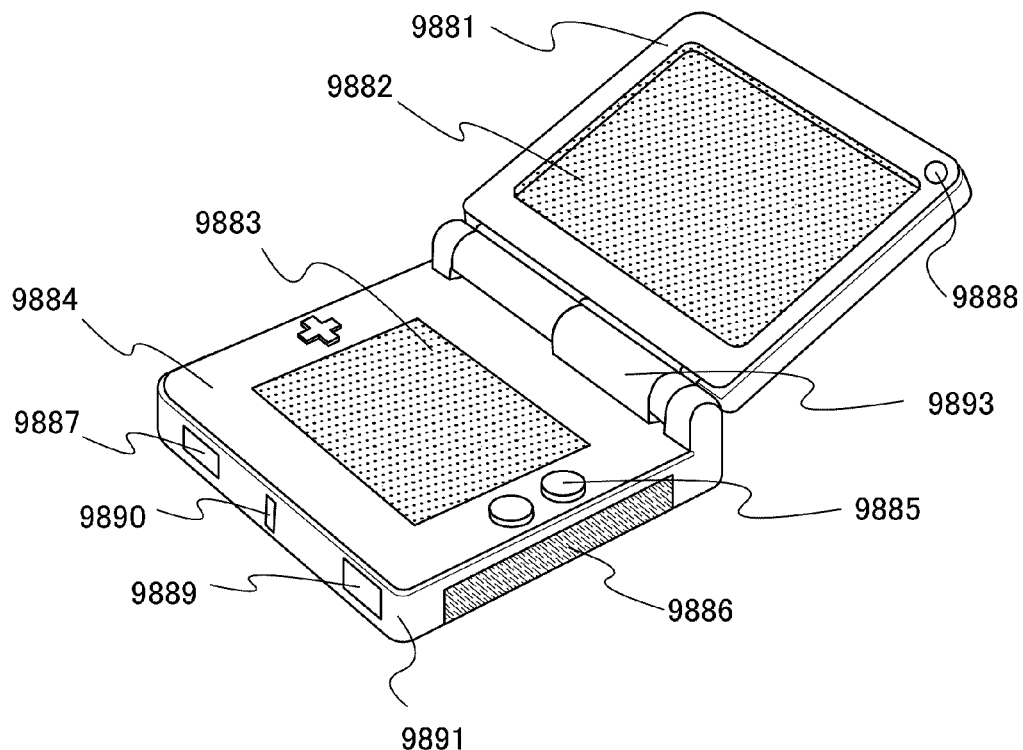
FIGS. 18A and 18B are external views illustrating examples of an amusement machine.

FIG. 18A illustrates a portable amusement console including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. The portable game console illustrated in FIG. 18A additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. It is needless to say that the structure of the portable amusement console is not limited to the above and other structures provided with at least a semiconductor device may be employed. The portable amusement machine may include an additional accessory equipment, as appropriate. The portable game console illustrated in FIG. 18A has a function of reading a program or data stored in a storage medium to display it on the display portion, and a function of sharing information with another portable game console via wireless communication. The portable game console of FIG. 18A can have a variety of functions other than those above.

Figure 18B:
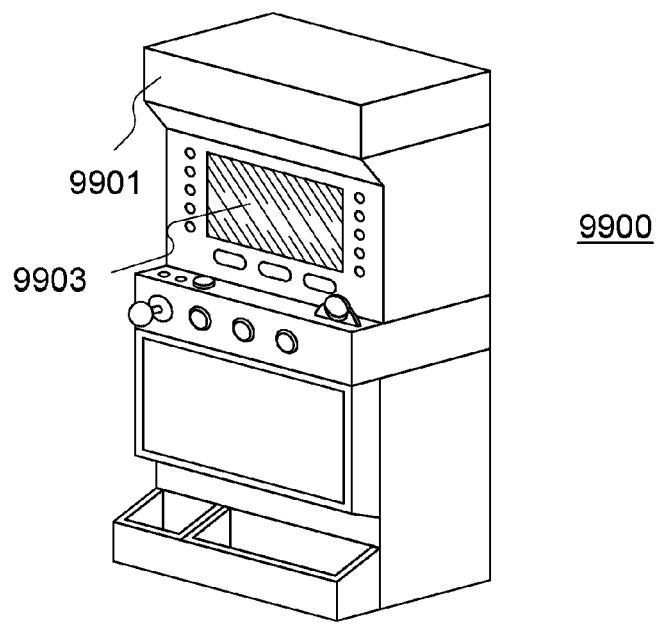

FIG. 18B illustrates an example of a slot machine, which is a large game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device may be employed. The slot machine 9900 may include an additional accessory equipment, as appropriate.

Figure 19A:
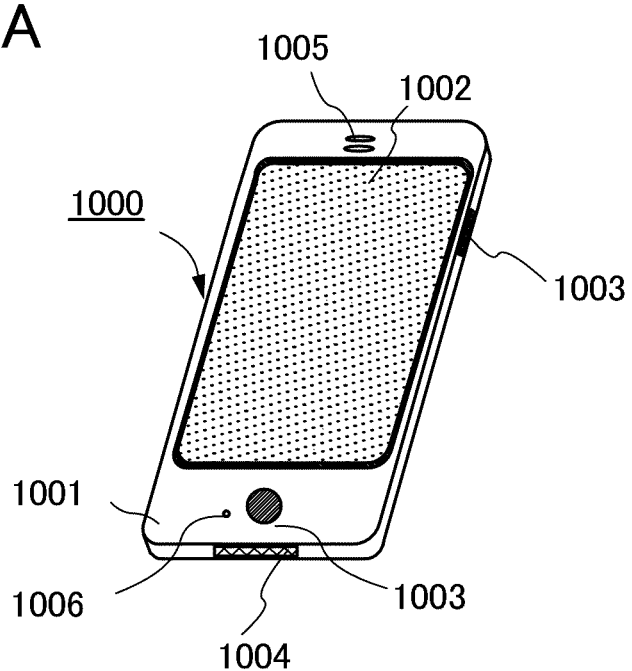
FIGS. 19A and 19B are external views illustrating examples of a mobile phone handset.

FIG. 19A illustrates an example of a mobile phone handset. A mobile phone handset 1000 includes a display portion 1002 incorporated in a housing 1001, operation buttons 1003, an external connection port 1004, a speaker 1005, a microphone 1006 and the like.

When the display portion 1002 of the mobile phone handset 1000 illustrated in FIG. 19A is touched with a finger or the like, information can be input into the mobile phone handset 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically switched by determining the installation direction of the mobile phone handset 1000 (whether the mobile phone handset 1000 is placed horizontally or vertically for a landscape mode or a portrait mode).

The screen modes are switched by touching the display portion 1002 or operating the operation buttons 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 19B:
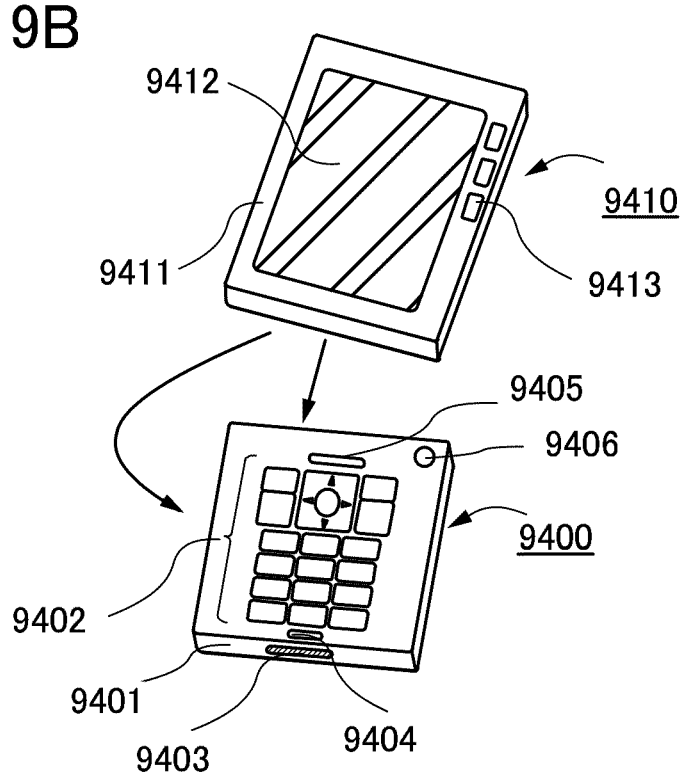

FIG. 19B also illustrates an example of a mobile phone handset. The mobile phone handset in FIG. 19B includes a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 having a display function can be detached from and attached to the communication device 9400 having a telephone function in two directions shown by arrows. Accordingly, the display device 9410 and the communication device 9400 can be attached to each other along respective short axes or long axes. When only the display function is needed, the display device 9410 can be detached from the communication device 9400 and used alone. Images or input information can be transmitted or received by wireless or wire communication between the communication device 9400 and the display device 9410, each of which has a rechargeable battery.

Note that this embodiment can be implemented in combination with the above embodiment as appropriate.

This application is based on Japanese Patent Application serial no. 2010-115940 filed with Japan Patent Office on May 20, 2010, the entire contents of which are hereby incorporated by reference.

What is claimed is:

1. A method for manufacturing a semiconductor device, comprising the steps of:
   forming a gate electrode over an insulator;
   forming a gate insulating layer over the gate electrode;
   adding cations containing oxygen to the gate insulating layer;
   forming a first oxide semiconductor layer over the gate insulating layer;

adding cations containing oxygen to the first oxide semiconductor layer;

forming a second oxide semiconductor layer over the first oxide semiconductor layer after adding the cations containing oxygen to the first oxide semiconductor layer;

forming a source electrode and a drain electrode over the second oxide semiconductor layer; and forming an insulating layer over the second oxide semiconductor layer, the source electrode, and the drain electrode;

wherein a heat treatment is performed at the time of the adding cations containing oxygen to the first oxide semiconductor layer, and wherein a concentration of hydrogen in the gate insulating layer is less than or equal to $5 \times 10^{20}$ atoms/cm$^3$.

2. The method for manufacturing the semiconductor device according to claim 1, wherein the first oxide semiconductor layer and the second oxide semiconductor layer comprise indium, gallium, and zinc.

3. The method for manufacturing the semiconductor device according to claim 2, wherein the first oxide semiconductor layer and the second oxide semiconductor layer further comprise tin.

4. The method for manufacturing the semiconductor device according to claim 1, wherein the gate insulating layer comprises at least one of silicon oxide, silicon oxynitride, silicon nitride, silicon nitride oxide, aluminum oxide, and tantalum oxide.

5. The method for manufacturing the semiconductor device according to claim 1, wherein the step of adding the cations is performed by one selected from an electron cyclotron resonance (ECR) plasma method, a helicon wave plasma (HWP) method, an inductively coupled plasma (ICP) method, and a microwave-excited surface wave plasma (SWP) method; or a combination thereof.

6. The method for manufacturing the semiconductor device according to claim 1, wherein the first oxide semiconductor layer and the second oxide semiconductor layer are formed by a sputtering method.

7. The method for manufacturing the semiconductor device according to claim 1, wherein a flow rate ratio of an oxygen gas to an argon gas when forming the second oxide semiconductor layer is smaller than a flow rate ratio of an oxygen gas to an argon gas when forming the first oxide semiconductor layer.

8. The method for manufacturing the semiconductor device according to claim 1, wherein the first oxide semiconductor layer is formed in an oxygen atmosphere or an atmosphere in which a flow rate of an oxygen gas is 1 time or more that of a rare gas.

9. The method for manufacturing the semiconductor device according to claim 1, wherein the second oxide semiconductor layer is formed in a rare gas atmosphere or an atmosphere containing an oxygen gas at 10% or less and a rare gas at 90% or more.

10. A method for manufacturing a semiconductor device, comprising the steps of:

forming a first oxide semiconductor layer over an insulator;

adding cations containing oxygen to the first oxide semiconductor layer;

forming a second oxide semiconductor layer over the first oxide semiconductor layer after adding the cations containing oxygen to the first oxide semiconductor layer;

forming a source electrode and a drain electrode over the second oxide semiconductor layer;

forming a gate insulating layer over the second oxide semiconductor layer, the source electrode, and the drain electrode; and forming a gate electrode over the gate insulating layer, wherein a heat treatment is performed at the time of the adding cations containing oxygen to the first oxide semiconductor layer.

11. The method for manufacturing the semiconductor device according to claim 10, wherein the first oxide semiconductor layer and the second oxide semiconductor layer comprise indium, gallium, and zinc.

12. The method for manufacturing the semiconductor device according to claim 11, wherein the first oxide semiconductor layer and the second oxide semiconductor layer further comprise tin.

13. The method for manufacturing the semiconductor device according to claim 10, wherein the gate insulating layer comprises at least one of silicon oxide, silicon oxynitride, silicon nitride, silicon nitride oxide, aluminum oxide, and tantalum oxide.

14. The method for manufacturing the semiconductor device according to claim 10, wherein the step of adding the cations is performed by one selected from an electron cyclotron resonance (ECR) plasma method, a helicon wave plasma (HWP) method, an inductively coupled plasma (ICP) method, and a microwave-excited surface wave plasma (SWP) method; or a combination thereof.

15. The method for manufacturing the semiconductor device according to claim 10, wherein the first oxide semiconductor layer and the second oxide semiconductor layer are formed by a sputtering method.

16. The method for manufacturing the semiconductor device according to claim 10, wherein a flow rate ratio of an oxygen gas to an argon gas when forming the second oxide semiconductor layer is smaller than a flow rate ratio of an oxygen gas to an argon gas when forming the first oxide semiconductor layer.

17. The method for manufacturing the semiconductor device according to claim 10, wherein the first oxide semiconductor layer is formed in an oxygen atmosphere or an atmosphere in which a flow rate of an oxygen gas is 1 time or more that of a rare gas.

18. The method for manufacturing the semiconductor device according to claim 10, wherein the second oxide semiconductor layer is formed in a rare gas atmosphere or an atmosphere containing an oxygen gas at 10% or less and a rare gas at 90% or more.

19. The method for manufacturing the semiconductor device according to claim 1, wherein the cations added to the insulating layer further contain oxygen.

20. The method for manufacturing the semiconductor device according to claim 1, wherein a hydrogen concentration in the insulating layer is $1 \times 10^{21}$ atoms/cm$^3$ or less.

21. The method for manufacturing the semiconductor device according to claim 1, wherein a nitrogen concentration in the insulating layer is $1 \times 10^{19}$ atoms/cm$^3$ or less.

22. The method for manufacturing the semiconductor device according to claim 10, wherein the cations added to the gate insulating layer further contain oxygen.

23. The method for manufacturing the semiconductor device according to claim 10, wherein a nitrogen concentration in the gate insulating layer is $1 \times 10^{19}$ atoms/cm$^3$ or less.

24. The method for manufacturing the semiconductor device according to claim 10, further comprising the steps of:
forming an insulating layer over the gate insulating layer and the gate electrode; and
adding cations containing halogen to the insulating layer.

25. The method for manufacturing the semiconductor device according to claim 24, wherein the cations added to the insulating layer further contain oxygen.

26. The method for manufacturing the semiconductor device according to claim 24, wherein a hydrogen concentration in the insulating layer is $1\times10^{21}$ atoms/cm$^3$ or less.

27. The method for manufacturing the semiconductor device according to claim 24, wherein a nitrogen concentration in the insulating layer is $1\times10^{19}$ atoms/cm$^3$ or less.

28. A method for manufacturing a semiconductor device, comprising the steps of:
forming a gate electrode over an insulator;
forming a gate insulating layer over the gate electrode;
adding cations containing oxygen to the gate insulating layer;
forming a first oxide semiconductor layer over the gate insulating layer;
adding cations containing oxygen and halogen to the first oxide semiconductor layer;
forming a second oxide semiconductor layer over the first oxide semiconductor layer after adding the cations containing oxygen and halogen to the first oxide semiconductor layer;
forming a source electrode and a drain electrode over the second oxide semiconductor layer; and
forming an insulating layer over the second oxide semiconductor layer, the source electrode, and the drain electrode;
wherein a heat treatment is performed at the time of the adding cations containing oxygen and halogen to the first oxide semiconductor layer, and
wherein a concentration of hydrogen in the gate insulating layer is less than or equal to $5\times10^{20}$ atoms/cm$^3$.

29. The method for manufacturing the semiconductor device according to claim 28, wherein the first oxide semiconductor layer and the second oxide semiconductor layer comprise indium, gallium, and zinc.

30. The method for manufacturing the semiconductor device according to claim 28, wherein the step of adding the cations is performed by one selected from an electron cyclotron resonance (ECR) plasma method, a helicon wave plasma (HWP) method, an inductively coupled plasma (ICP) method, and a microwave-excited surface wave plasma (SWP) method; or a combination thereof.

31. The method for manufacturing the semiconductor device according to claim 28, wherein the first oxide semiconductor layer and the second oxide semiconductor layer are formed by a sputtering method.

32. The method for manufacturing the semiconductor device according to claim 28, wherein a flow rate ratio of an oxygen gas to an argon gas when forming the second oxide semiconductor layer is smaller than a flow rate ratio of an oxygen gas to an argon gas when forming the first oxide semiconductor layer.

33. The method for manufacturing the semiconductor device according to claim 28, wherein the first oxide semiconductor layer is formed in an oxygen atmosphere or an atmosphere in which a flow rate of an oxygen gas is 1 time or more that of a rare gas.

34. The method for manufacturing the semiconductor device according to claim 28, wherein the cations added to the insulating layer further contain oxygen.

35. The method for manufacturing the semiconductor device according to claim 28, wherein a hydrogen concentration in the insulating layer is $1\times10^{21}$ atoms/cm$^3$ or less.

36. The method for manufacturing the semiconductor device according to claim 28, wherein a nitrogen concentration in the insulating layer is $1\times10^{19}$ atoms/cm$^3$ or less.

* * * * *